(12) United States Patent
Shimada et al.

(10) Patent No.: US 7,154,206 B2
(45) Date of Patent: Dec. 26, 2006

(54) SURFACE ACOUSTIC WAVE DEVICE AND METHOD FOR MANUFACTURING SAME

(75) Inventors: Mitsutaka Shimada, Kokubu (JP); Yoshifumi Yamagata, Soraku-gun (JP); Kazuhiro Otsuka, Soraku-gun (JP); Masafumi Hisataka, Kokubu (JP); Akira Oikawa, Kokubu (JP); Michihiko Kuwahata, Kokubu (JP); Masaru Yamano, Kokubu (JP)

(73) Assignee: Kyocera Corporation, Kyoto (JP)

( * ) Notice: Subject to any disclaimer, the term of this patent is extended or adjusted under 35 U.S.C. 154(b) by 163 days.

(21) Appl. No.: 10/628,881

(22) Filed: Jul. 28, 2003

(65) Prior Publication Data

US 2004/0113215 A1 Jun. 17, 2004

(30) Foreign Application Priority Data

| Jul. 31, 2002 | (JP) | ............................. 2002-222582 |
| Jul. 31, 2002 | (JP) | ............................. 2002-222583 |
| Oct. 30, 2002 | (JP) | ............................. 2002-316788 |
| Oct. 30, 2002 | (JP) | ............................. 2002-316791 |
| Oct. 30, 2002 | (JP) | ............................. 2002-316792 |
| Jan. 29, 2003 | (JP) | ............................. 2003-021101 |
| Jan. 29, 2003 | (JP) | ............................. 2003-021104 |

(51) Int. Cl.
*H01L 41/08* (2006.01)

(52) U.S. Cl. ................................. 310/313 R

(58) Field of Classification Search ............ 310/313 R, 310/344, 348, 340
See application file for complete search history.

(56) References Cited

U.S. PATENT DOCUMENTS

| 6,262,513 B1 * | 7/2001 | Furukawa et al. ...... 310/313 R |
| 6,498,422 B1 * | 12/2002 | Hori ........................... 310/344 |
| 6,643,920 B1 * | 11/2003 | Hori ........................... 29/832 |
| 6,815,869 B1 * | 11/2004 | Baba et al. ............. 310/313 R |

FOREIGN PATENT DOCUMENTS

JP  10-270979  9/1998

\* cited by examiner

*Primary Examiner*—Karl Tamai
*Assistant Examiner*—Karen B Addison
(74) *Attorney, Agent, or Firm*—Hogan & Hartson LLP

(57) ABSTRACT

A surface acoustic wave device is disclosed, which comprises a surface acoustic wave element including a lithium tantalate piezoelectric substrate 10 with one principal surface thereof formed with an IDT electrode 11, a connector electrode 12 and a periphery sealing electrode 13, and a base substrate 2 formed with an electrode 21 for connection to the element connected to the connector electrode 12 through a solder bump component 3 and a periphery sealing conductor film 22 joined to the periphery sealing electrode 13 thorough a solder sealing component 4. For the solder bump component 3 and the solder sealing component 4, a Sn—Sb based or Sn—Ag based lead-free solder containing 90% or more Sn is used, and the thermal expansion coefficient of the base substrate 2 is set in the range of 9–20 pm/° C. The joining is accomplished with high stability resisting thermal stress due to a difference in thermal expansion coefficient, so that a surface acoustic wave device that can maintain stable connection for a long duration of time can be provided.

11 Claims, 16 Drawing Sheets

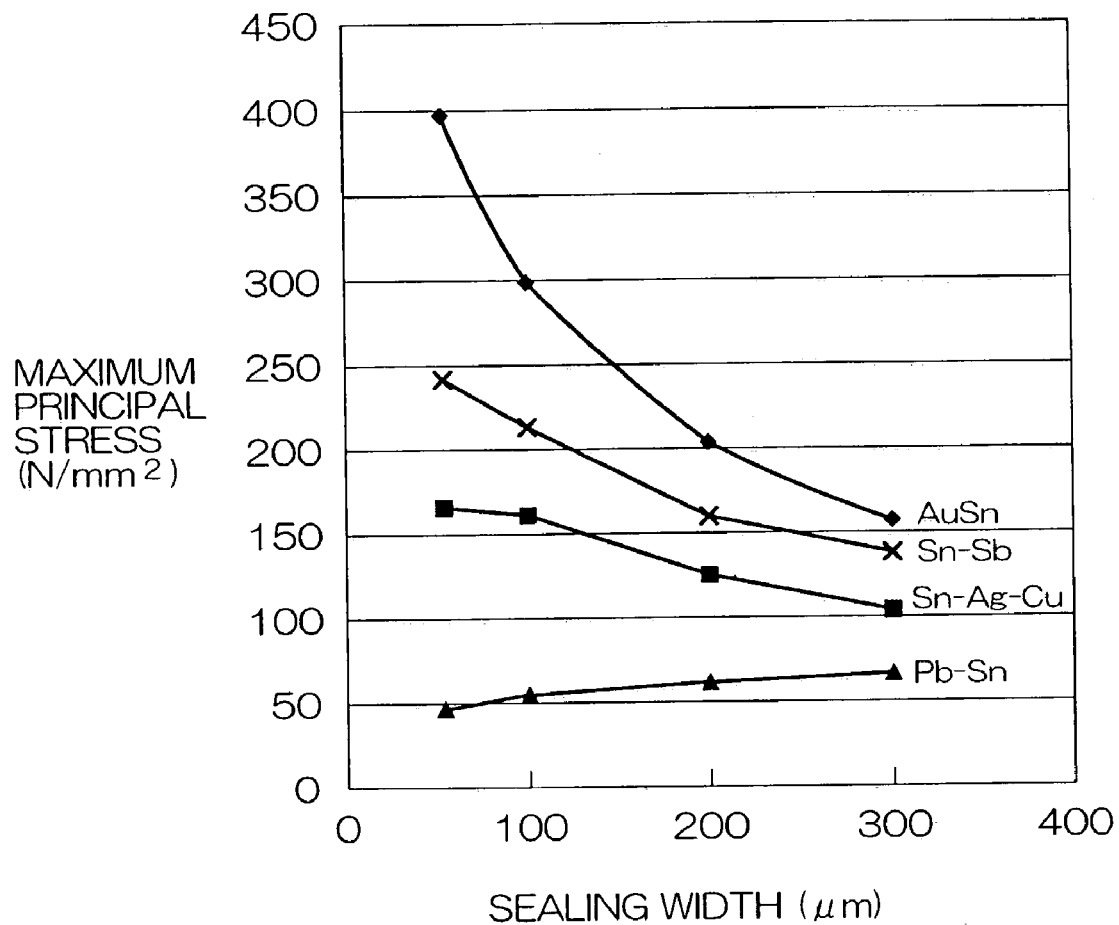

SURFACE ACOUSTIC WAVE DEVICE AND METHOD FOR MANUFACTURING SAME

This application is based on applications Nos. 2002-222582, 2002-222583, 2002-316788, 2002-316791, 2002-316792, 2003-21101 and 2003-21104 filed in Japan, the content of which is incorporated hereinto by reference.

BACKGROUND OF THE INVENTION

1. Field of the Invention

The present invention relates to a surface acoustic wave device which comprises a surface acoustic wave element that is formed with an inter digital transducer electrode (hereinafter referred to as "IDT electrode"), a connector electrode and a periphery sealing electrode and joined to a base substrate through a solder bump component and a solder sealing component, and a method for manufacturing the same.

2. Description of the Related Art

Conventional surface acoustic wave devices include a monocrystal piezoelectric substrate such as a lithium tantalate substrate or a lithium niobate substrate with one principal surface formed with an IDT electrode, in which a connector electrode for providing signals to and receiving signals from the IDT electrode is formed on the same principal surface.

These IDT electrode and the connector electrode are formed on the piezoelectric substrate with use of aluminum or the like by a thin film forming method.

The base substrate comprises, for example, alumina ceramics or the like, and an electrode for connection to the element connected to the connector electrode of the surface acoustic wave element is disposed on the principal surface of the base substrate.

There has been a known structure using solder bumps for joining such a connector electrode of the surface acoustic wave element to the electrode for connection to the element of the base substrate.

In this case, Pb/Sn (for example, 95Pb/5Sn) is generally used for the solder for joining the surface acoustic wave element and the base substrate together.

In the structure in which solder bumps are used, unlike the case where gold bumps are used for connection of the surface acoustic wave element, it is not necessary to apply ultrasonic vibration to the surface acoustic wave element, so that physical damage to the surface acoustic wave element can be significantly suppressed. When a heat treatment such as a solder reflow treatment is carried out, the lead component in the solder has the function to absorb stress caused by the difference in thermal expansion coefficient between the substrate and the surface acoustic wave element. This is because the lead component contained in the solder is a relatively soft material, and even if stress is generated due to the difference in thermal expansion coefficient, it can be mitigated by the soft lead. That is, using a solder containing lead makes it unnecessary to strictly consider the thermal expansion coefficients of the base substrate and the surface acoustic wave element, and allows for relatively inexpensive, easy joining.

However, since lead-containing solders used for joining components contribute to deterioration of the environment, the use thereof is to be restricted.

In addition, because of the weak yield stress of the solder materials containing great amounts of lead, when thermal stress is generated due to the difference in thermal expansion coefficient between the surface acoustic wave element and the substrate, great amounts of plastic strain and creep strain are caused. As far as the performance during the soldering operation is concerned, such materials seem to be able to absorb the thermal stress as described above. However, when they are subjected to a temperature cycle test assuming an actual long duration of use, stress due to the difference in thermal expansion coefficient between the surface acoustic wave element and the base substrate acts intensely on the solder joint. The stress repeatedly acts on the solder joint causing metal fatigue in that section, finally breaking the joint.

In addition, in the foregoing surface acoustic wave device, since heat from the solder reflow or the like also propagates to the interior of the surface acoustic wave device when it is mounted on the motherboard, the soldering material that joins the surface acoustic wave element and the base substrate together is also subjected to heat. As a result, the soldering material is expanded by the heat and the volume thereof is greatly expanded particularly during remelting.

The side surfaces of the surface acoustic wave device are covered with an outer covering resin layer which is firmly fixed to the base substrate. This causes the soldering material that has been expanded in volume due to the remelting to flow toward the interior of the gap between the surface acoustic wave element and the base substrate. As a result, short circuit would occur in the connector electrode of the surface acoustic wave element.

In addition, due to the use of a pyroelectric component for the surface acoustic wave element of the surface acoustic wave device, sparks are generated during the reflow treatment between electrode fingers of the comb-shaped IDT electrode engaged with one another on the piezoelectric substrate, causing pyroelectric breakdown to occur in the IDT electrode. The generation of sparks becomes prominent when the speed of temperature increase during the reflow treatment is high. For this reason, pyroelectric breakdown has been conventionally prevented from occurring by lowering the speed of temperature increase. However, in this way, the reflow treatment takes too long time, which makes it difficult to manufacture surface acoustic wave devices with high efficiency.

When the reflow treatment is performed in a chamber with a nitrogen atmosphere, the surface acoustic wave element must be kept stably mounted on the base substrate. This is because misalignment cannot be corrected after the base substrate and the surface acoustic wave device are introduced into the chamber because of the nitrogen atmosphere of the chamber. To deal with this problem, conventionally, a flux is contained in the solder bumps and the viscosity of the flux in the solder bumps is utilized for stable temporary fixing of the surface acoustic wave element to the base substrate.

However, if the reflow treatment is carried out in such a condition, the flux component scatters inside the gap surrounded by the solder sealing component and adheres to the surface of the surface acoustic wave element, leading to deterioration of the properties.

In addition, when solder bumps containing or provided with a flux are used, the solder bumps close the gap formed between the base substrate and the surface acoustic wave element before the reflow treatment in the chamber with a nitrogen atmosphere. For this reason, even if the pressure inside the chamber is reduced to bring the chamber into a nitrogen atmosphere, it is difficult to reliably bring the gap region formed between the surface acoustic wave element and the base substrate into a nitrogen atmosphere.

It is an object of the present invention to provide a surface acoustic wave device in which a base substrate is joined to a surface acoustic wave element employing a piezoelectric substrate, which allows very stable joining to be accomplished resisting thermal stress due to a difference in thermal expansion coefficient and permits stable connection to be maintained for a long duration of time.

It is another object of the present invention to provide a surface acoustic wave device in which electrical short circuit in the surface acoustic wave element due to remelting of the inside solder at the time of mounting on a motherboard or the like is prevented from occurring.

It is still another object of the present invention to provide a method for manufacturing a surface acoustic wave device with high manufacturing efficiency that is able to preclude breakdown of the surface acoustic wave element due to sparks and deterioration of the properties, and to reliably and simply bring the inside of the gap into a nitrogen atmosphere.

BRIEF SUMMARY OF THE INVENTION (a) A surface acoustic wave device according to the present invention comprises: a surface acoustic wave element including a piezoelectric substrate which includes one principal surface formed with an inter digital transducer electrode, a connector electrode connected to the inter digital transducer electrode and a periphery sealing electrode; a base substrate formed with an electrode for connection to the element that is connected to the connector electrode, a periphery sealing conductor film joined to the periphery sealing electrode, and an external terminal electrode; and an outer covering resin layer attached to cover an another principal surface and a side surface of the surface acoustic wave element, wherein the connector electrode and the electrode for connection to the element are joined together through a solder bump component and the periphery sealing electrode and the periphery sealing conductor film are joined together through a solder sealing component so that a predetermined gap is formed between the base substrate and the surface acoustic wave element, the solder bump component and the solder sealing component comprise a Sn—Sb based or Sn—Ag based lead-free solder containing 90% or more Sn, and the base substrate has a thermal expansion coefficient of 9–20 ppm/° C.

In the present invention, electrical connection between the base substrate and the surface acoustic wave element is accomplished by means of a solder bump component comprising a Sn—Sb based or Sn—Ag based solder containing 90% or more Sn, and mechanical joining between the base substrate and the surface acoustic wave element is accomplished by means of the solder sealing component, in particular, around one principal surface (the surface on which the IDT electrode is formed) of the surface acoustic wave element.

Because of the use of a Sn—Sb based lead-free solder containing 90% or more Sn for the solder bump component and solder sealing component, metal fatigue caused by thermal stress due to the difference in thermal expansion coefficient is reduced, so that stable connection is maintained for a long duration of time as compared with conventional cases where solders containing lead are used for the joining.

Although the Sn—Sb based lead-free solder containing 90% or more Sn less easily absorbs the thermal stress than solders containing lead, since the present invention takes difference between the thermal expansion coefficient in the propagation direction of the piezoelectric substrate such as a lithium tantalate substrate and the thermal expansion coefficient in the direction orthogonal to the propagation direction into consideration and distinctly specifies the thermal expansion coefficient of the base substrate as 9–20 ppm/° C., even stress that cannot be absorbed by the solder sealing component does not cause strain or warpage to occur in the surface acoustic wave element and the base substrate.

Accordingly, it is possible to maintain stable joining even when the device is subjected to a temperature cycle test assuming the actual use thereof.

The solder sealing component is provided along the periphery sealing conductor film to surround one principal surface of the piezoelectric substrate. That is, because the gap between the surface acoustic wave element and the base substrate is surrounded by the stably joining solder component, the gap can be kept hermetically sealed.

The material for the base substrate having a thermal expansion coefficient of 9–20 ppm/° C. may be a glass-ceramic substrate comprising glass ceramics at interfaces among an inorganic filler particles. It is capable of adapting to the thermal expansion coefficient of a lithium tantalate substrate having direction dependence with excellent stability.

As discussed so far, according to the present invention, joining can be accomplished with excellent stability resisting thermal stress due to the difference in thermal expansion coefficient, and a surfaced acoustic wave device capable of maintaining stable junction for a long duration of time can be provided.

(b) A surface acoustic wave device according to the present invention comprises: a surface acoustic wave element including a piezoelectric substrate which includes one principal surface formed with an inter digital transducer electrode, a connector electrode connected to the inter digital transducer electrode and a periphery sealing electrode; a base substrate formed with an electrode for connection to the element that is connected to the connector electrode, a periphery sealing conductor film joined to the periphery sealing electrode and an external terminal electrode; and a side surface covering resin layer attached to cover a side surface of the surface acoustic wave element and an outer peripheral surface of the solder sealing component, wherein the side surface covering resin layer has an elastic modulus which follows a change of a gap between the base substrate and the surface acoustic wave element caused by volume expansion of the solder bump component and the solder sealing component at a melting temperature of the solder bump component and the solder sealing component.

In the present invention, the surface acoustic wave element is joined to the base substrate so that a predetermined gap is formed between the base substrate and one principal surface of the surface acoustic wave element and the side surfaces of the surface acoustic wave element and the outer peripheral surface of the solder sealing component are covered with a side surface covering resin layer. This side surface covering resin layer has an elastic modulus which follows changes of the gap between the base substrate and the surface acoustic wave element caused by volume expansion of the solder bump component and solder sealing component at a melting temperature of the solder bump component and solder sealing component.

When the surface acoustic wave device is mounted on a motherboard or the like, the solder bump component and solder sealing component are fused by heat of the solder reflow and expand in volume. Due to the stress caused by the volume expansion, a force acts to lift the surface acoustic wave element. At this time, the side surface covering component also extends to follow the change of the gap between the surface of the base substrate and the principal surface of the surface acoustic wave element. Accordingly, there is no risk of short circuit failures occurring as a result of the solder of remelted solder bump component and solder sealing component flowing toward the interior of the gap between the surface acoustic wave element and the base substrate.

According to the present invention, the side surface covering component is made of a thermally reversible resin that returns to the original state when the mounting of the surface acoustic wave device to the motherboard is completed and the temperature of the surface acoustic wave device returns to room temperature. Accordingly, the original reliability of the surface acoustic wave device is not impaired.

Furthermore, in the present invention, a mass per unit volume at temperatures between 180° C. and 250° C. of the surface acoustic wave element and the side surface covering resin component is smaller than a mass per unit volume at temperatures between 180° C. and 250° C. of the solder bump component and the solder sealing component. By this arrangement, buoyancy generated in the surface acoustic wave element during the fusing of the solder bump component and the solder sealing component strengthens the force to lift the surface acoustic wave element, thereby further ensuring expansion of the gap between the surface of the base substrate and the principal surface of the surface acoustic wave element.

(c) A method for manufacturing a surface acoustic wave device according to the present invention comprises the steps of: forming a first solder bump for a solder bump component on either of the electrode for connection to the element of the base substrate and the connector electrode of the surface acoustic wave element; forming a second solder bump having a height smaller than that of the first solder bump on either of the periphery sealing conductor film of the base substrate and the periphery sealing electrode of the surface acoustic wave element; electrically connecting and temporarily fixing the electrode for connection to the element of the base substrate to the connector electrode of the surface acoustic wave element by means of the first solder bump; and thereafter fusing the first solder bump and the second solder bump in a predetermined atmosphere so that the periphery sealing conductor film in the base substrate section and the periphery sealing electrode of the surface acoustic wave element are hermetically sealed and joined to each other by means of the second solder bump.

In the method for manufacturing a surface acoustic wave device according to the present invention, when the surface acoustic wave element is joined to the base substrate through the solder bump component and solder sealing component, the height of projection of the first solder bump for the solder bump component is arranged to be larger than the height of projection of the second solder bump for the solder sealing component.

Accordingly, first, the electrode for connection to the element of the base substrate is temporarily connected to the connector electrode of the surface acoustic wave element using the first solder bump with a higher projection.

In the temporarily fixed state, the gap between the base substrate and the surface acoustic wave element is in communication with the outside air over the second solder bump because of the low projection of the second solder bump. That is, it is not necessary to consider the atmosphere of the gap between the surface acoustic wave element and the base substrate, so that the temporary fixing operation can be performed, for example, in atmospheric air.

This makes it possible to temporarily retain the surface acoustic wave elements in the respective substrate sections in a collective manner using a large-size base substrate from which a plurality of base substrates can be extracted. As a result, even when misalignment occurs during the operation of mounting the acoustic wave elements on the base substrate, it can be immediately corrected.

Moreover, it is also possible to greatly reduce or substantially eliminate the flux component which is conventionally supplied to the solder for retention. Therefore, enclosure of the flux component within the gap between the surface acoustic wave element and the base substrate will not occur and surface acoustic wave devices with stable properties can be obtained.

Subsequently, the periphery sealing conductor film of the base substrate and the periphery sealing electrode of the surface acoustic wave element are hermetically sealed and joined to each other in a chamber with a nitrogen atmosphere by means of the second solder bump.

When the hermetical sealing is performed, since the inside of the gap between the surface acoustic wave element and the base substrate is very easily brought into a nitrogen atmosphere, while stable joining can be accomplished.

The hermetical sealing is performed with the base substrate being mounted on a metal block for a heat treatment. In this condition, since the connector electrode of the surface acoustic wave element has been connected to the electrode for connection to the element of the base substrate through the solder bump component, short circuit is allowed to occur between adjacent electrode fingers of the IDT electrode via the metal block, so that they have the same potential. Therefore, pyroelectric breakdown between adjacent IDT electrode fingers can be completely prevented from occurring.

In this hermetical sealing and joining process, the solder bump component that has been temporarily joined previously is also fused again. As a result, the heights of the solder bump component and solder sealing component correspond to each other, resulting in a gap with a uniform thickness formed between the surface acoustic wave element and the base substrate. Consequently, the amount of extension in the horizontal direction of the first bump is greater than the amount of extension in the horizontal direction of the second solder bump.

The relationship between the amounts of extension of the first solder bump and second solder bump may be expressed as $(S1/L1)>(S2/L2)$, where the area of a vertical cross-section of the solder bump component is S1, the area of a vertical cross-section of the solder sealing component is S2, the soldering width of a vertical cross-section of the connector electrode formed on the surface acoustic wave element is L1, and the soldering width of a vertical cross-section of the periphery sealing electrode of the surface acoustic wave element is L2.

Incidentally, the first and second solder bumps can be formed to have a semicircular cross-sectional profile utilizing surface tension by applying a solder paste to a predetermined electrode or a conductor film on the side of the base substrate or the surface acoustic wave element, and fusing the applied solder by heating. Accordingly, when the solder paste on the side of the first solder bump is printed a greater number of times than the second solder bump, or the amount of application per unit area thereof is greater than that of the second solder bump, the height of projection of the first solder bump can be made greater than the height of projection of the second solder bump. Alternatively, the thickness or apertures of the screen plate for the solder paste may be controlled so that the amount of application on the first solder bump side is greater than that of the second solder bump side, thereby making the height of projection of the first solder bump greater than the height of projection of the second solder bump.

Incidentally, in forming the first and second solder bumps, the solder bumps are fused by heat and thereafter subjected to cleaning. By this treatment, the flux can be washed off. Accordingly, the flux component which is otherwise to be enclosed in the gap between the surface acoustic wave element and the base substrate can be removed before the surface acoustic wave element and the base substrate are electrically connected and hermetically sealed and joined to each other.

Also, the arrangement may be such that a large-size base substrate comprising a plurality of base substrates formed with the electrode for connection to the element and the periphery sealing conductor film is prepared, surface acoustic wave elements are joined to the respective base substrate sections, and the large-size base substrate is cut to be separated into individual base substrate sections. As a result, a plurality of devices can be substantially collectively manufactured, so that the manufacturing efficiency can be drastically improved.

BRIEF DESCRIPTION OF THE DRAWINGS

FIG. 5 shows a comparison of maximum principal stress among different solder compositions.

DETAILED DESCRIPTION OF THE INVENTION

<Surface Acoustic Wave Device>

Figure 1:
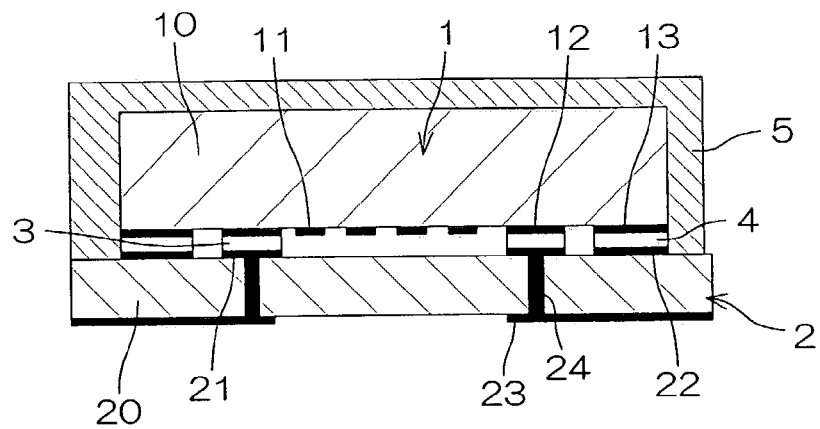
FIG. 1 shows a cross-sectional structure of a surface acoustic wave device according to the present invention.
Figure 2:
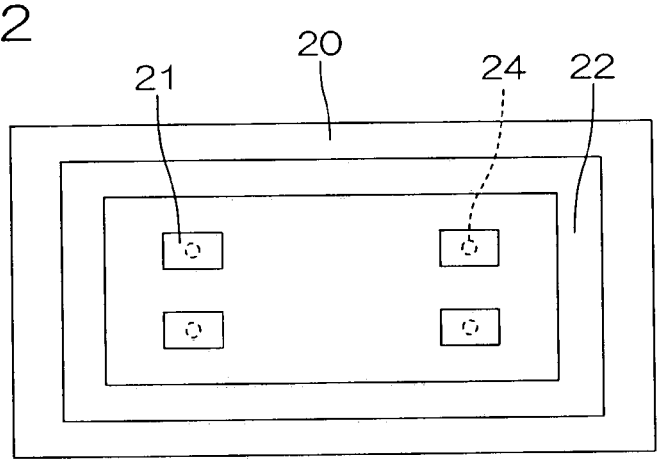
FIG. 2 is a plan view of a base substrate used for the surface acoustic wave device according to the present invention.
Figure 3:
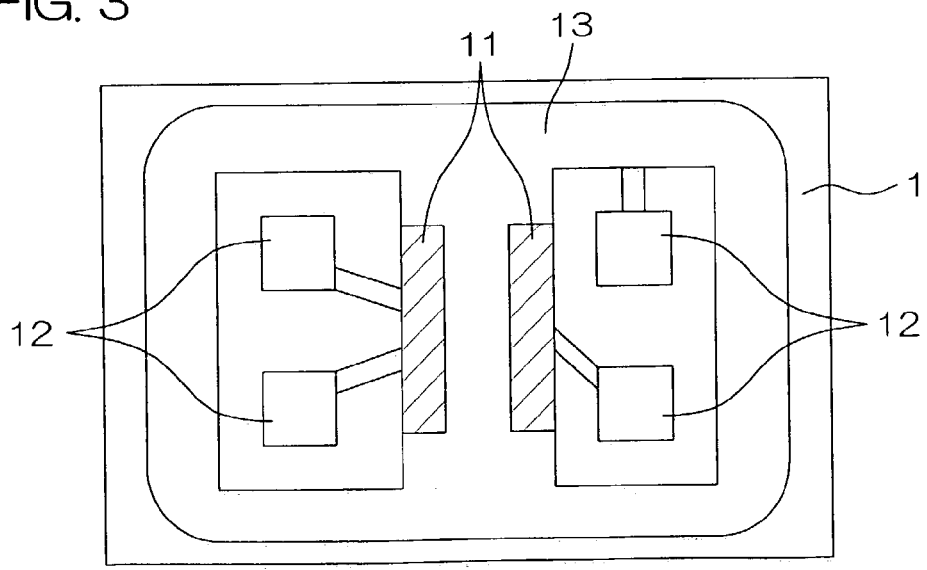
FIG. 3 is a plan view of various electrode patterns formed on one principal surface of a surface acoustic wave element used for the surface acoustic wave device according to the present invention.

FIG. 1 is a cross-sectional view of a surface acoustic wave device according to the present invention and FIG. 2 is a schematic plan view of a base substrate used for the surface acoustic wave device of the present invention. FIG. 3 is a schematic plan view showing various electrodes formed on one principal surface of a surface acoustic wave element.

The surface acoustic wave device comprises a surface acoustic wave element 1, a base substrate 2, a solder bump component 3, a solder sealing component 4 and an outer covering resin layer 5.

A surface acoustic wave resonator, surface acoustic wave filter or the like may be quoted as an example of the surface acoustic wave element 1. Each of them comprises a piezoelectric substrate 10 composed of quartz, lithium niobate ($LiNbO_3$), lithium tantalate ($LiTaO_3$) or the like, an Inter Digital Transducer electrode (including a comb-shaped electrode and reflector electrode, which is hereinafter simply referred to as the "IDT electrode") formed on one principal surface of the piezoelectric substrate 10 and a connector electrode 12 connected to the IDT electrode 11. The IDT electrode 11 is formed in the center of the piezoelectric substrate 10 in a propagation direction, and the connector electrode 12 is formed so as to extend from predetermined parts of the IDT electrode 11 to be disposed around the IDT electrode 11. The connector electrode 12 comprises, for example, a signal input electrode, a signal output electrode, a ground potential electrode and the like.

In addition, in the periphery of the principal surface the surface where the IDT electrode 11 and connector electrode 12 are formed) of the piezoelectric substrate 10, a periphery sealing electrode 13 is formed. The periphery sealing electrode 13 is preferably in the ground electric potential. The periphery sealing electrode 13 hermetically seals the periphery of the gap formed between the surface acoustic wave element 1 and the base substrate 2. Incidentally, the electrodes 11–13 are each formed, for example, in such a manner that an aluminum layer, aluminum-copper layer or the like is formed on the surface of the piezoelectric substrate 10 by photolithography and then, if necessary, a plating layer comprising chromium, nickel, gold or the like is formed on the surface thereof.

The base substrate 2 may comprise a material having a thermal expansion coefficient of 9–20 ppm/° C., for example, a multilayer substrate comprising glass-ceramic material, or an alumina substrate or the like. The substrate comprising glass-ceramic material comprises an inorganic filler made of alumina powder and glass ceramics filled among interfaces of the inorganic filler. Powders of two or more metal oxides (such as boric acid, silica and zinc oxide) from which glass ceramics such as anorthite is precipitated are mixed with an organic binder and a solvent and homogeneously kneaded together to obtain a slurry, which is then formed into green sheets. The green sheets are laminated together and then fired to form an integral whole. Alternatively; the aforesaid slurry may be printed on a supporting substrate to be formed on the supporting substrate in a multilayered manner into an unfired multilayer body, which is then fired.

As shown in FIG. 2, the surface of the base substrate 2 is formed with an electrode 21 for connection to the element and a periphery sealing conductor film 22, and on the rear surface of the base substrate 2, an external terminal electrode 23 is formed. Moreover, in the interior of the base substrate 2, an interior wiring pattern 24 that includes a via-hole conductor for connecting the electrode 21 for connection to the element to the external terminal electrode 23 is formed.

The base substrate 2 may be a substrate other than the aforementioned glass-ceramic substrate, and may be a resin substrate reinforced by inorganic fiber such as glass fiber. For the resin, epoxy resin, polyimide resin and BT resin are preferable. In particular, BT resin is suitable for packaging of electronic devices because of its high air tightness and good moisture resistance. The surface of the resin substrate is provided with a laminated copper foil on which a pattern is formed using a photosensitive resist, and the interior wiring pattern 24, electrode 21 for connection to the element, periphery sealing conductor film 22, external terminal electrode 23 and the like are formed thereon by etching.

There are cases where using a resin substrate for the base substrate 2 is particularly more advantageous in some respects than using a ceramic substrate. Firstly, since wiring and electrode patterning are carried out using a photo-developing technique, the patterning can be done with high accuracy leading to high cutting accuracy at the time of chip separation with a dicing saw after collective formation on a large-size substrate. On the other hand, ceramic substrate is deformed during the firing causing the wiring and electrode patterns to become deformed. For this reason, the cutting accuracy at the time of dicing cannot be improved. Secondly, generally small dielectric constants of materials for resin substrate make stray capacitance less likely to occur. Accordingly, when a surface acoustic wave filter is mounted, the filter can be well-balanced and have good VSWR characteristics.

These conductor film and electrodes 21–24 are formed during the aforementioned substrate formation process by injecting a conductive paste such as silver paste into through-holes formed on the green sheet and printed film, and by printing on the surface of the green sheet and printed film into a predetermined configuration. Then they are laminated together and fired as a whole during the process for firing the base substrate 2.

Incidentally, the electrode 21 for connection to the element, periphery sealing conductor film 22 and external terminal electrode 23 are each formed such that the surface of a silver conductor film is treated with plating or the like so as to provide a metal surface having good solder wettability.

When the above described surface acoustic wave element 1 is joined to the base substrate 2, the connector electrode 12 of the surface acoustic wave element 1 is connected to the electrode 21 for connection to the element on the principal surface of the base substrate 2 by means of the solder bump component 3 so that a predetermined gap is formed between the principal surface of the base substrate 2 and one principal surface (the surface on which the IDT electrode 11 is formed) of the surface acoustic wave element 1, and the periphery sealing electrode 13 of the surface acoustic wave element 1 is joined to the periphery sealing conductor film 22 of the base substrate 2 by means of the solder sealing component 4. That is, the joining method used is face down bonding with the use of solder.

Meanwhile, this joining is performed such that the space between the base substrate 2 and the surface acoustic wave element 1 has a predetermined atmosphere, for example, nitrogen atmosphere.

In addition, the other principal surface and side surfaces of the surface acoustic wave element 1 that is joined to the base substrate 2 are covered all over with the outer covering resin layer 5. Epoxy resin, polyimide resin or the like may be used for the outer covering resin layer 5.

One of the particular features of the present invention is that when the surface acoustic wave element 1 using the piezoelectric substrate 10 is joined by face down bonding, the thermal expansion coefficient of the base substrate 2 is controlled to be in the range of 9–20 ppm/° C. by taking the anisotropic thermal expansion coefficient into consideration, and that a lead-free solder material containing 90% or more Sn is employed for the solder used for connection and joining between the base substrate 2 and the surface acoustic wave element 1.

In other words, in the present invention, a Sn—Sb based or Sn—Ag based solder that is a lead-free solder material containing 90% or more Sn is used for the above mentioned solder bump component 3 and the solder sealing component 4.

With this arrangement, the solder bump component 3 and the solder sealing component 4 can be formed on the electrode and the conductor film 21, 22 of the base substrate 2 all at once, which allows the process cost to be greatly reduced. In addition, since the melting point of the solder material can be 250° C. or below, strain between the surface acoustic wave element 1 and the base substrate 2 can be suppressed, so that generation of cracks in the surface acoustic wave element 1 can be effectively prevented. Accordingly, the effect to reduce the amount of plastic strain between the surface acoustic wave element 1 and the base substrate 2 becomes remarkable, making it possible to ensure long term, high reliability. Furthermore, if a glass-ceramic material having the effect to resist moisture penetration is used for the base material 2, materials with low resistance such as silver and copper can be employed for the electrode 21 for connection to the element, internal wiring pattern 24 and the like, so that excellent high frequency characteristics can be achieved.

The periphery sealing electrode 13 is formed all over the periphery of the piezoelectric substrate 10 of the surface acoustic wave element 1, and this portion is joined to the periphery sealing conductor film 22 by means of the solder sealing component 4. Accordingly, the sealing performance is greatly improved thereby completely eliminating moisture penetration routes, so that the air tightness is significantly improved.

If the same material is used to form the solder sealing component 4 for hermetical sealing and the solder bump component 3 for electrically connecting the surface acoustic wave element 1 to the base substrate 2, for example, the operation to form the solder bump component 3 and that to form the solder sealing component 4 on the base substrate 2 can both be done within the same process, and the connection by means of the solder bump component 3 and the joining by means of the solder sealing component 4 can also be done within the same process.

<Manufacturing Method>

A method for manufacturing a surface acoustic wave device according to the present invention will be hereinafter described referring to FIGS. 4A–4F.

A large-size base substrate from which a plurality of base substrates 2 can be extracted is first prepared. On one principal surface of the section for each surface acoustic wave device (the section that forms a base substrate 2 after cutting or separation) of this large-size base substrate, an electrode 21 for connection to the element and a periphery sealing conductor film 22 are formed. On the other principal surface of the section, an external terminal electrode 23 is formed, and an internal wiring pattern 24 is formed in the section of each element (See FIG. 4A). Meanwhile, it is important that the surface configuration of each of the substrates is arranged to be size (for example, about 0.5 mm) larger than the surface configuration of the surface acoustic wave element 1.

Then, a solder bump component 3 for electrically connecting the surface acoustic wave element 1 to the base substrate 2 and a solder sealing component 4 for sealing the periphery of the piezoelectric substrate 10 are formed (See FIG. 4B) The solder bump component 3 and solder sealing component 4 are formed on the surface of the electrode 21 for connection to the element and the surface of the periphery sealing conductor film 22 each formed in the section for each element on the large-scale base substrate, respectively, by applying a solder in the form of paste. In order to form the paste into bumps, the applied solder is subjected to a primary heat treatment and cleaning. Through this procedure, the printed solders are shaped to have a semicircular cross section on the electrode 21 for connection to the element and the periphery sealing conductor film 22, and unnecessary flux can also be removed.

These solder bump component 3 and solder sealing component 4 are each formed on the base substrate 2. This is because if they are formed on the surface acoustic wave element 1, unwanted components including the solder may adhere to the IDT electrode 11 with very small spacing causing the surface acoustic wave element I to deteriorate. It is intended to avoid such phenomena.

Figure 4A:
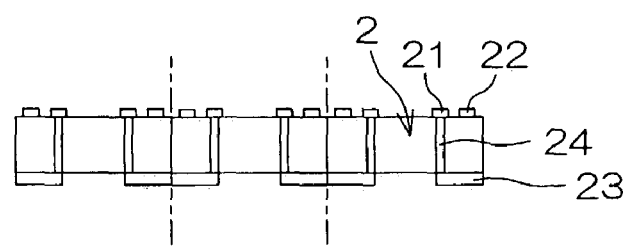
FIGS. 4A–4F are cross-sectional views illustrating steps included in the method for manufacturing the surface acoustic wave device according to the present invention.
Figure 4B:
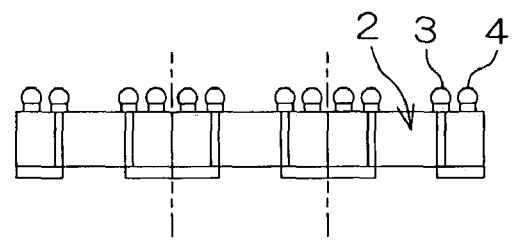
Figure 4C:
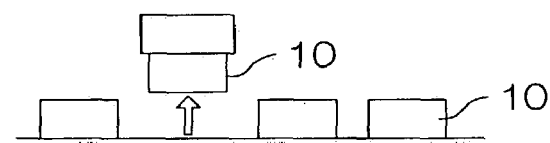
Figure 4D:
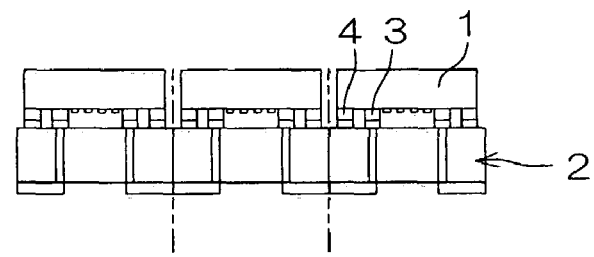
Figure 4E:
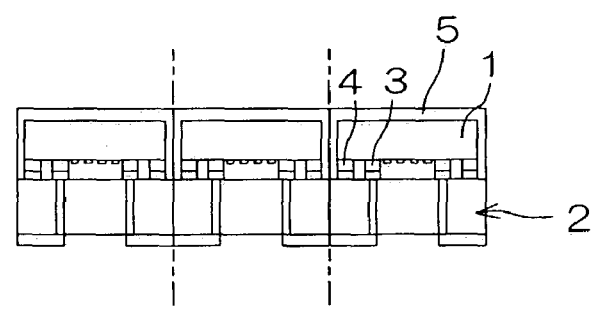

The piezoelectric substrate 11 is fabricated in the following manner. A large-size piezoelectric substrate made of lithium tantalate from which a plurality of piezoelectric substrates 10 can be extracted is prepared. As shown in FIG. 3, the section for each surface acoustic wave element on one principal surface of the large-size piezoelectric substrate is formed with an IDT electrode 11, a connector electrode 12 and a periphery sealing electrode 13 attached thereto. The principal surface of the piezoelectric substrate 10 is formed with the IDT electrode 11, the connector electrode 12 connected to the IDT electrode 11, and the periphery sealing electrode 13 that is arranged to surround the IDT electrode 11 and connector electrode 12 and disposed on the periphery of the substrate 10. The large-size piezoelectric substrate is cut to obtain individual surface acoustic wave elements 1, and thereafter, they are aligned, for example, in an alignment palette (FIG. 4C)

Subsequently, each of the surface acoustic wave elements 1 aligned in the palette is taken out (See FIG. 4C) to be mounted on the substrate section of the large-size base substrate. At this time, the connector electrode 12 of the surface acoustic wave element 1 is aligned with the solder bump component 3 formed on the electrode 21 for connection to the element in the substrate section, and simultaneously, the periphery sealing electrode 13 of the surface acoustic wave element 1 is aligned with the solder sealing component 4 formed on the periphery sealing conductor film 22 formed in the substrate section. As a result, the large-size base substrate is provided with the surface acoustic wave elements 1 temporarily mounted on the respective substrate sections.

Then, the large-size base substrate with the surface acoustic wave elements 1 mounted thereon as a whole is subjected to a reflow treatment. Electrical connection between the base substrate and the surface acoustic wave elements 1 is established by the solder bump components 3, and both are mechanically joined to each other as well as the gaps are hermetically sealed with the solder sealing components 4 (See FIG.4 D). As a result, gaps corresponding to the heights of the solder bump component 3 and solder sealing component 4 can be formed between the principal surfaces of the surface acoustic wave elements 1 and the surface of the large-size base substrate, which allows surface acoustic waves generated from the surface acoustic wave elements 1 to propagate stably along the surface. Incidentally, it is possible to provide the gaps with a nitrogen atmosphere by carrying out the reflow treatment in the nitrogen atmosphere.

Subsequently, resin paste that serves as outer covering resin layer 5, for example, epoxy resin paste is applied to the other principal surfaces (exposed surfaces)of the surface acoustic wave elements 1 that have been electrically connected and mechanically joined to the large-size base substrate, and then it is cured. At this time, since the surface area of each of the substrate sections of the large-size base substrate is greater than the surface area of the surface acoustic wave element 1, the epoxy resin also fills the gaps between every adjacent pair of the surface acoustic wave elements 1. That is, the other principal surface and side surfaces of each of the surface acoustic wave elements 1 are covered with the outer covering resin layer 5 (See FIG. 4E).

Figure 4F:
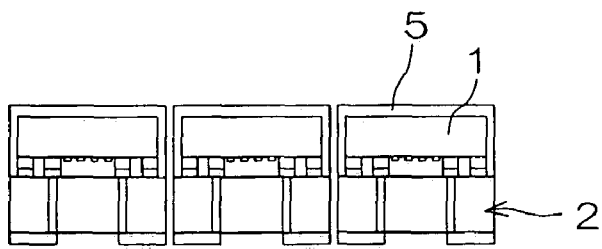

In the next step, the large-size base substrate that has been provided with a plurality of the surface acoustic wave elements 1 mounted thereon and covered with the outer covering resin layers 5 is cut by dicing so that each of the substrate sections is kept covered with the outer covering resin layer 5 (FIG. 4F).

Through the steps described above, the surface acoustic wave device shown in FIG. 1 is obtained.

In the present invention, a Sn—Sb based or Sn—Ag based solder containing 90% or more Sn is used for the solder bump component 3 and solder sealing component 4. For example, Sn—Sb solder, Sn—Ag—Cu solder, or Sn—Ag solder is employed. The present inventors performed measurements using typical four kinds of solders including the foregoing solders, namely, Sn—Sb, Sn—Ag—Cu, Sn—Pb, Sn—Au solders, in which the sealing width of the solder on the periphery sealing conductor film 22 was varied from 50 to 300 μm.

The results are shown in FIG. 5. In FIG. 5, the horizontal axis represents sealing width (unit: μm), and the vertical axis represents maximum principal stress (unit: N/mm²).

Sn—Pb solder is of poor usefulness when environmental friendliness is taken into consideration. Although lead-containing solder has small maximum principal stress, when subjected to a temperature cycle test or the like, it incurs metal fatigue resulting in lowering of the joining reliability.

Sn—Ag solder has too high yield stress. As a result, the residual stress in the solder sealing component 4 affects the surface acoustic wave element 1 when it is joined to the base substrate 2. For instance, it has been revealed that when the maximum principal stress exceeds 200 N/mm², cracking occurs in the surface acoustic wave element 1 when it is joined to the base substrate 2 and also during the temperature cycle test. In other words, since the maximum principal stress also depends on the sealing width of the solder sealing component 4, it is necessary to adjust the solder material and the sealing width to be used for the joining based upon the results in FIG. 5 so that the maximum principal stress at the solder sealing component 4 does not exceed 200 N/mm².

From the foregoing discussion, it is found that using Sn—Sb based or Sn—Ag based solder for the solder sealing component 4 is important. In addition, unless the composition contains 90% or more Sn, soldering cannot be accomplished stably. As described previously, the solder bump component 3 is formed in the same process as the solder sealing component 4, and connected in the same process. For this reason, using the same composition for both the solder bump component 3 and solder sealing component 4 facilitates handling of the solder bump component 3 and the solder sealing component 4.

The present inventors used Sn—Sb based solder and Sn—Ag based solder in joining piezoelectric substrate 10 to base substrate 2 (where the thermal expansion coefficient of lithium tantalate was 16 ppm/° C., the linear expansion coefficient in the propagation direction of surface waves was about 16 ppm/° C., and the linear expansion coefficient in the direction orthogonal to the surface wave propagation direction was about 8.3 ppm/° C.), and sought for the best-suited base substrate 2.

The present inventors used six kinds of substrate materials for the base substrate 2 whose thermal expansion coefficients were within the range of 7–25 ppm/° C. The material used for the solder was Sn—Ag—Cu based solder. By setting the sealing width, for example, to 200 μm, the present inventors investigated relationship between the amount of plastic strain of the base substrate and mean time to failure. The amount of plastic strain refers to the ratio of strain at one side of the base substrate 2 to the thickness of the substrate while the base substrate 2 is joined to the surface acoustic wave element 1. The mean time to failure was obtained from the average number of occurrences of failure resulted from the repetition of a cycle −40° C. to 125° C. for 30 minutes.

Figure 6:
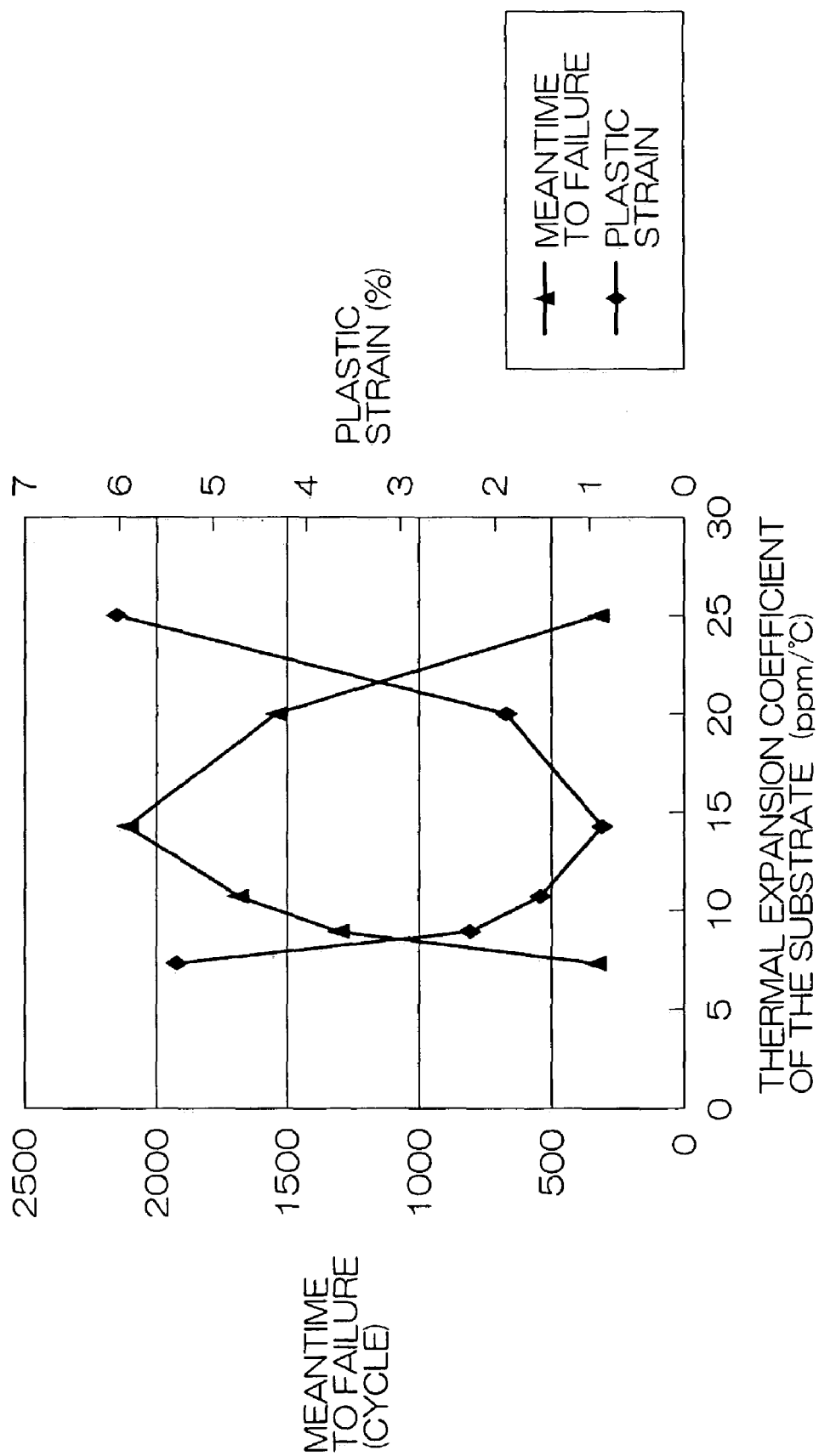
FIG. 6 shows relationship among thermal expansion coefficient of the substrate, amount of plastic strain, and mean time to failure.

As a result, a graph shown in FIG. 6 was obtained. In FIG. 6, the horizontal axis represents thermal expansion coefficient of the substrate (unit:ppm/° C.), the vertical axes represent mean time to failure (unit:cycle)and ratio of plastic strain (unit: %).

As is apparent from FIG. 6, the amount of plastic strain and the mean time to failure each have a distinct correlation with the thermal expansion coefficient of the base substrate. Specifically, when the thermal expansion coefficient of the base substrate is in the range of 9–20 ppm/° C., the amount of plastic strain can be less than 2.0%, and hence the mean time to failure can be 1000 cycles or more.

On the other hand, when the thermal expansion coefficient of the base substrate is less than 9 ppm/° C., stress caused by the difference in thermal expansion coefficient between the base substrate 2 and the surface acoustic wave element 1 increases. As a result, the amount of plastic strain becomes so great that failure occurs before the number of temperature cycles reaches 1000.

Alumina-ceramic substrate (7.1 ppm/° C.) seemed to be a possible material for such a substrate. However, in this case, the crack generation rate in the surface acoustic wave element immediately after the joining exceeds 30%. In addition, cracks are generated in the surface acoustic wave element 1 at a rate of 2–3% during 10 temperature cycles. Judging also from the strain in the base substrate and stress at the joints, this material does not reach the level of practical use.

When, on the contrary, the thermal expansion coefficient of the base substrate exceeds 20 ppm/° C., stress caused by the difference in thermal expansion coefficient between the base substrate 2 and the surface acoustic wave element 1 increases. As a result, the amount of plastic strain becomes so great that failure occurs before the number of temperature cycles reaches 1000.

Meanwhile, when the above stated range of 9–20 ppm/° C. is taken into consideration, a glass-ceramic substrate comprising alumina-ceramic powder as an inorganic filler and glass-ceramics distributed in the interfaces among the powder particles may be quoted as an example. Depending on the composition of the glass-ceramics and blending of the alumina-ceramic powder and glass-ceramics, the substrate can have a relatively freely adjusted thermal expansion coefficient.

The present inventors fabricated a surface acoustic wave device by joining a base substrate 2 of 10.6 ppm/° C. to a surface acoustic wave element 1 including a piezoelectric substrate 10 by means of a solder bump component 3 and a solder sealing component 4 composed of Sn—Ag—Cu (96.5 Sn-3.0 Ag-0.5 Cu) solder. Epoxy resin was used for the outer covering resin layer 5 whose thermal expansion coefficient was 30 ppm/° C. and Young's Modulus was 660 kgf/mm².

As a result, the maximum principal stress before the joining was about 137 N/mm², and that after the joining (after generation of plastic strain) was about 78 N/mm². No cracks were generated in the surface acoustic wave element 1 after the sealing or even after 10 times of the temperature cycle test. In addition, the mean time to failure during the temperature cycle test was 1700 cycles.

The present inventors also fabricated a surface acoustic wave device by joining a base substrate 2 of 12.3 ppm/° C. to a surface acoustic wave element 1 including a piezoelectric substrate 10 by means of a solder bump component 3 and solder sealing component 4 composed of Sn—Ag—Cu (96.5 Sn-3.0 Ag-0.5 Cu)solder. Epoxy resin was used for the outer covering resin layer 5 whose thermal expansion coefficient was 30 ppm/° C. and Young's Modulus was 6468 kgf/mm².

As a result, the maximum principal stress before the joining was about 98 N/mm², and that after the joining (after generation of plastic strain) was about 68 N/mm². No cracks were generated in the surface acoustic wave element 1 after the sealing or even after 10 times of the temperature cycle test. In addition, the mean time to failure during the temperature cycle test was 1800 cycles.

As for the thermal expansion coefficient of the piezoelectric substrate 10, the linear expansion coefficient in the propagation direction of surface waves was about 16 ppm/° C., and the linear expansion coefficient in the direction orthogonal to the surface wave propagation direction was about 8.3 ppm/° C. However, the foregoing studies revealed that the dominant thermal expansion coefficient is 16.0 ppm/° C. which is the linear expansion coefficient in the surface wave propagation direction. As a result, the center value 14.94 in the range for the thermal expansion coefficient of the base substrate 2 is slightly high as compared with 12.15 ppm/° C., which is a value of arithmetic mean in which dependence on the direction of the piezoelectric substrate 10 is taken into account. With the value set as above, even if the thermal expansion coefficient of the piezoelectric substrate 10 varies depending on the direction, practically such a directional factor can be ignored. Thus, concerning the base substrate 2, solder bump component 3 and solder sealing component 4, the above-described combination of the solder material and base substrate can provide an inexpensive surface acoustic wave device that can be manufactured by an easy method.

<Projecting Cross-section Profile of Solder Bump Component>

Figure 7:
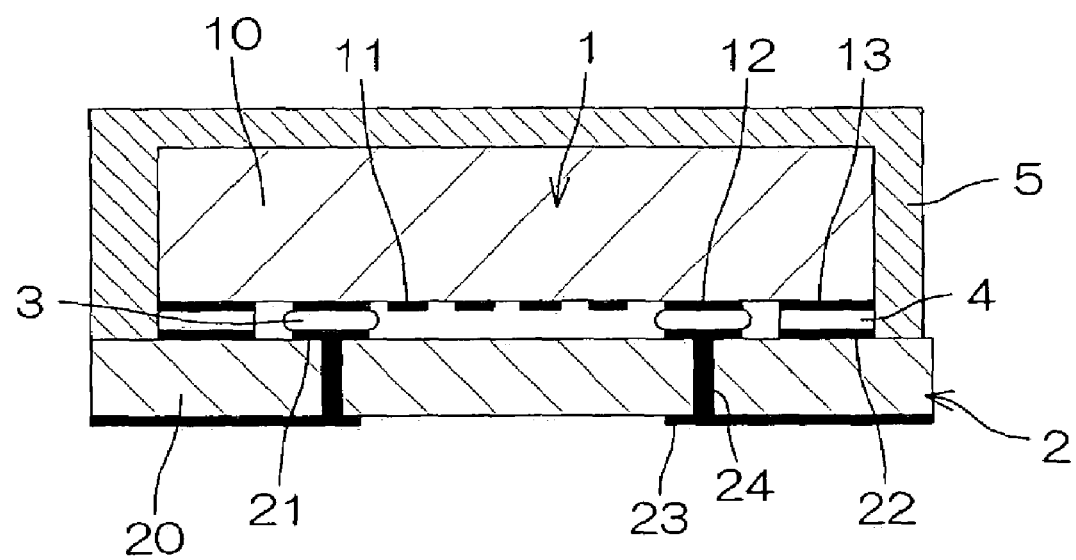
FIG. 7 shows a cross-sectional structure of another embodiment of the surface acoustic wave device according to the present invention.

FIG. 7 is a cross-sectional view of another embodiment of the surface acoustic wave device according to the present invention.

The surface acoustic wave device comprises a surface acoustic wave element 1, a base substrate 2, a solder bump component 3, solder sealing component 4 and an outer covering resin layer 5. The components other than the solder bump component 3 have the same configurations and structures as those of the surface acoustic wave device described referring to FIG. 1. Explanation thereof will not be repeated here.

Figure 8A:
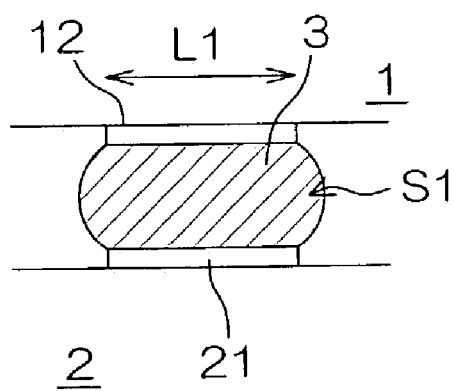
FIG. 8A is a vertical cross-sectional view of a solder bump component.
Figure 8B:
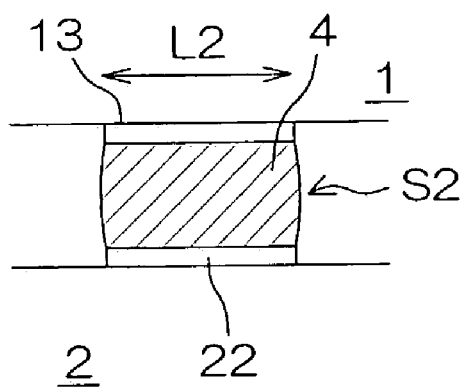
FIG. 8B is a vertical cross-sectional view of a solder sealing component.
Figure 8C:
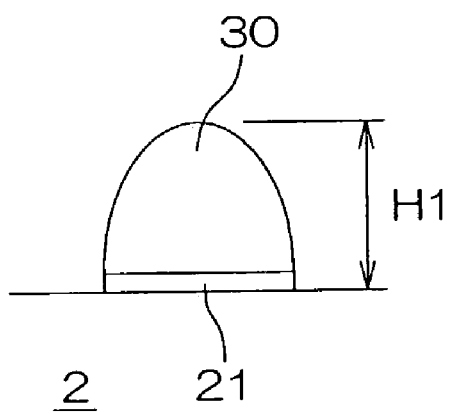
FIG. 8C is a vertical cross-sectional view of a first solder bump to serve as the solder bump component.
Figure 8D:
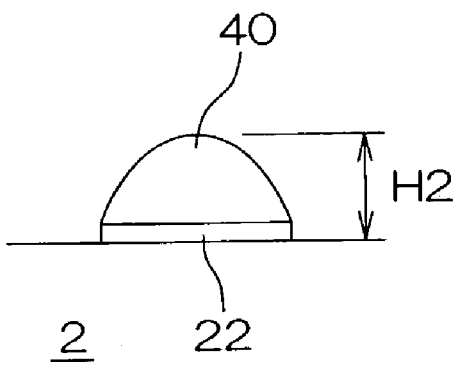
FIG. 8D is a vertical cross-sectional view of a second solder bump to serve as the solder sealing component.

FIG. 8A shows a vertical cross-section of a part where the surface acoustic wave element 1 and the base substrate 2 are electrically connected to each other by means of the solder bump component 3. FIG. 8B shows a vertical cross-section of a part where a gap is hermetically sealed with the solder sealing component 4. FIG. 8C shows a vertical cross-section of a first solder bump before joining which is to serve as solder bump component. FIG. 8D shows a vertical cross-section of a second solder bump before joining which is to serve as solder sealing component.

One of the particular features of the present invention is that, as shown in FIGS. 8A and 8B, a relationship of (S1/L1)>(S2/L2) is satisfied where a vertical cross-sectional area of the solder bump component 3 is represented by S1, a vertical cross-sectional area of the solder sealing component 4 is represented by S2, a soldering width of a vertical cross-section of the connector electrode 12 formed on the surface acoustic wave element 1 is represented by L1, and a soldering width of a vertical cross-section of the periphery sealing electrode 13 of the surface acoustic wave element 1 is represented by L2. Although the widths of the electrodes on the side of the surface acoustic wave element 1 are used as the references for the soldering widths, it is also possible to use soldering widths of vertical cross-sections of the electrode 21 for connection to the element and the periphery sealing conductor film 22 as the references.

In addition, as shown in FIGS. 8C and 8D, it is preferred that, in a condition before soldering of the solder bump component 3 and solder sealing component 4, the height of projection of the first solder bump 30 for the solder bump component 3 is larger than the height of projection H1 of the second solder bump 40 for the solder sealing component 4. That is, H1>H2. For example, the height of projection H2 of the second solder bump 40 for the solder sealing component 4 may be 28 μm, and the height of projection H1 of the first solder bump 30 for the solder bump component 3 may be 32 μm. Accordingly, since the heights of the solder bum component 3 and the solder sealing component 4 are the same (which are the height of the gap between the surface acoustic wave component 1 and the base substrate 2 e.g. 20 μm) after the hermetical sealing and joining (See FIG. 1), as shown in FIG. 8A, the bulge in the conductor portion at the vertical cross-section of the solder bump component 3 is large, and as shown in FIG. 8B, the bulge in the conductor portion of the solder sealing component 4 is smaller than that of the solder bump component 3.

A method for manufacturing a surface acoustic wave device according the present invention will be described below with reference to FIG. 9. This method for manufacturing a surface acoustic wave device includes many common parts with the method described referring to FIG. 4. Description of the common parts will be omitted or simplified.

Figure 9A:
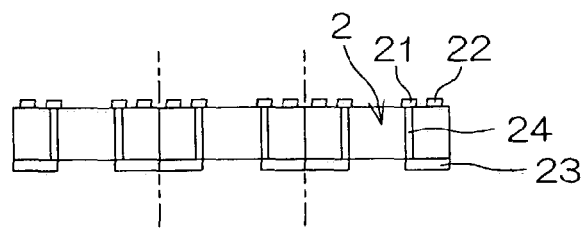
FIGS. 9A–9G are cross-sectional views illustrating steps included in the method for manufacturing the surface acoustic wave device of FIG. 7.

First, electrode patterns 21–24 are formed in the sections for base substrates 2 formed in a large-size base substrate (See FIG. 9A).

Figure 9B:
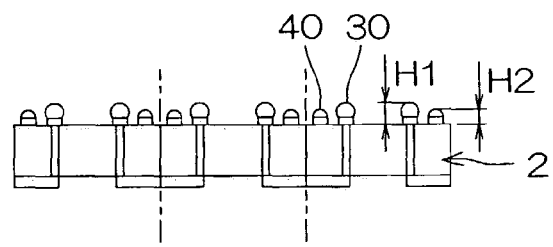
Figure 9C:
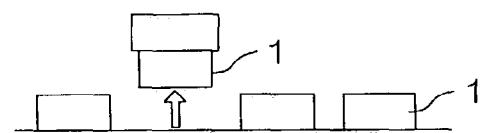

Then, a first solder bump 30 for electrically connecting a surface acoustic wave element 1 and the base substrate section 2 and a second solder bump 40 for hermetically sealing and joining the surface acoustic wave element 1 and the base substrate section 2 to each other are formed (See FIG. 9B).

The first solder bump 30 and second solder bump 40 are formed, for example, by applying a solder paste a predetermined number of times onto an electrode 21 for connection to the element and a periphery sealing conductor film 22 in the base substrate section 2, and then by fusing the applied solder paste. Through this procedure, the molten solder paste is formed into a solder bump with a generally semicircular cross-sectional profile by surface tension on the electrode 21 for connection to the element. Then, cleaning is performed to remove the flux component that is included in the solder paste and is floating on the surface of the solder as a result of the fusing.

The solder bump component 3 and solder sealing component 4 are formed on the side of the base substrate 2. This is because if they are formed on the surface acoustic wave element 1, unwanted components including the solder may adhere to the IDT electrode 11 with very small spacing causing the properties of the surface acoustic wave element 1 to deteriorate. It is intended to avoid such phenomena.

According to the present invention, the height of projection H1 of the fist solder bump 30 for the solder bump component 3 is arranged to be larger than the height of projection H2 of the second solder bump 40 for the solder sealing component 4 (See FIG. 9B). Accordingly, a solder paste for the second solder bump 40 is applied onto the periphery sealing conductor film 22, for example, by carrying out printing once, and the solder paste for the first solder bump 30 is applied onto the electrode 21 for connection to the element, for example, by carrying out printing twice. Alternatively, the widths of the apertures of the screen plate for printing the solder paste are modified so that the width of the screen plate at the area where the first solder bump 30 is formed onto the electrode 21 for connection to the element is wider and the amount of the paste applied is greater. As a result, it is possible to arrange the height of projection H1 of the first solder bump 30 after fusing to be about 32 μm, and the height of projection H2 of the second solder bump 40 after fusing to be about 28 μm.

Subsequently, an IDT electrode 11, a connector electrode 12, and a periphery sealing electrode 13 are attached to each of the element sections of the piezoelectric substrates 10. The surface acoustic wave elements 1 are then taken out of an alignment palette (See FIG. 9C).

Thereafter, the surface acoustic wave elements 1 are mounted on the respective substrate sections of the large-size base substrate 6. At this time, the connector electrode 12 of the surface acoustic wave element 1 is aligned with the electrode 21 for connection to the element in the substrate section 2, and simultaneously, the periphery sealing electrode 13 of the surface acoustic wave element 1 is aligned with the periphery sealing conductor film 22 in the substrate section 2. At this time, due to the difference in height of projection between the first solder bump 30 and the second solder bump 40, the surface acoustic wave element 1 is temporarily supported only by the first solder bump 30.

Figure 9D:
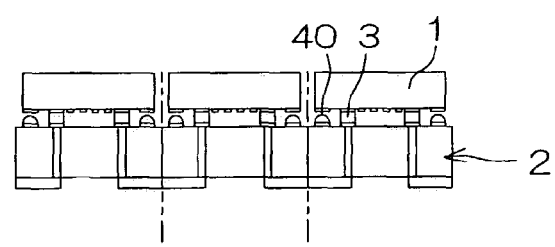

Incidentally, in the state of FIG. 9D, the first solder bump 30 has already been electrically connected to the electrode 21 for connection to the element by fusing. For this reason, the first solder bump 30 is illustrated as solder bump component 3.

This temporary fixing is carried out, for example, in such a way that a metal heater block is heated up to a temperature (100–150° C.) at which the first solder bump 30 does not melt, and then the large-size base substrate is mounted on this metal heater block, and ultrasonic waves are applied to the surface acoustic wave elements 1 under a pressure so that the first solder bump 30 is caused to adhere by ultrasonic welding. Then, the second solder bump 40 is preferably attached to a part of the periphery sealing electrode 13.

Also, the process may be such that with a couple of metal heater blocks being heated, they are held on the bottom side of the large-size base substrate 2 and on the upper side of the surface acoustic wave elements 1. In this case, the joining can be accomplished by applying heat and pressure at the same time.

What is important in carrying out these temporary fixing processes is not to permit the second solder bump 40 to come in contact with a part of the outer peripheral sealing electrode 13 of the surface acoustic wave element 1 even if the first solder bump 30 with a greater height fuses and therefore the height of projection is reduced.

This temporary fixing can be carried out in atmospheric air. Accordingly, the soldering can be performed in a stable manner as described above, and even when misalignment occurs during the temporary fixing process, it can be recognized visually and easily corrected.

In addition, the foregoing temporary fixing methods are effective to prevent the surface acoustic wave element 1 from pyroelectric breakdown. That is, since the height of projection of the first solder bump 30 is distinctly larger than that of the second solder bump 40, the connector electrode 12 is always soldered earlier than the periphery sealing electrode 13 of the surface acoustic wave element 1. In this condition, short circuit occurs between adjacent electrode fingers of the IDT electrode 11 on the surface acoustic wave element 1 that are engaged with each other through the external terminal electrode 23 formed on the bottom surface of the large-size base substrate and the metal heater block, so that they have the same potential. Accordingly, there is no possibility of generation of sparks that cause pyroelectric breakdown between narrowly spaced electrode fingers of the IDT electrode 11.

Figure 9E:
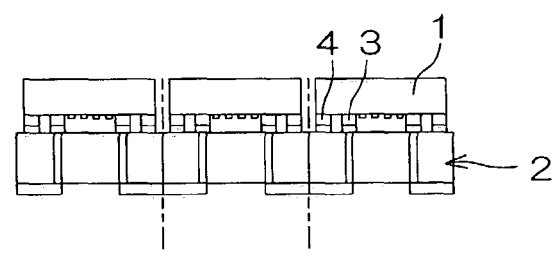
Figure 9F:
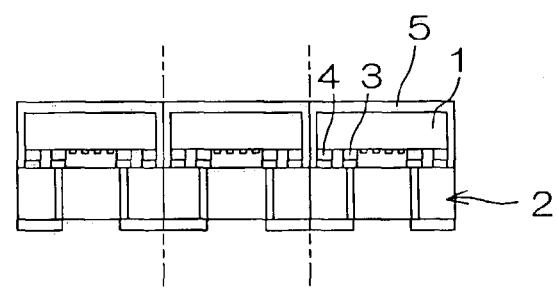

Subsequently, the large-size base substrate 2 having a plurality of the surface acoustic wave elements 1 mounted thereon in a temporarily fixed manner is subjected to joining for completely hermetically sealing the gap (See FIG. 9E). The large-size base substrate 2 is provided to join the solder bumps together in the hermetically sealed chamber of an atmosphere of nitrogen with the use of a heater block formed therein by a predetermined temperature profile. To describe specifically, the heater block of the large-size base substrate is delivered on the heater block and heat is applied by a predetermined profile, and the first solder bumps 3 and the second solder bump 4 are fused together completely. In this state, a second heater block may sandwich the surface acoustic wave elements 1 from the upper surface thereof, at a point of peak temperature in the temperature profile. The pressure can make the solder joining state more perfect, as well as thermal heating. The oxygen concentration in the nitrogen atmosphere inside the chamber may be 20 ppm or less, or desirably 10 ppm or less. By this concentration, the surface of the printed and formed solder joint from which flux is removed is prohibited from oxidization, and the electorodes can be hermetically sealed with a wettable join of the solders.

In the chamber wherein the nitrogen gas is introduced, the surface acoustic wave elements 1 are temporarily fixed onto the large-size base substrate 2, and the gap formed between the surface acoustic wave elements 1 and the large-size base substrate 2 has a larger height than the height of projection of the second solder bump 40. The nitrogen gas can therefore be stably distributed inside the gap.

Thereafter, the metal heater block is heated and pressed so as to fuse the temporarily fixed first solder bump 30 and the second solder bump 40 for hermetical sealing, thereby accomplishing electrical connection and hermetical sealing and joining. As a result, the gap between the large-size base substrate 2 and surface acoustic wave elements 1 has a height smaller than the height of projection of the second solder bump 40, e.g. 20 μm or so. That is, the initial height of projection of the first solder bump 30, for example, 32 μm becomes to be about 20 μm which is the height of the solder bump component 3, and the initial height of projection of the second solder bump 40, for example, 28 μm becomes to be 20 μm which is the height of the solder bump component 3. Accordingly, the bulge of the conductor portion at a vertical cross-section of the solder bump component 3 is larger than the bulge of the conductor portion of the solder sealing component 4.

In this hermetical sealing and joining process, because of the surface acoustic wave elements 1 having been temporarily fixed to the large-size base substrate 2, misalignment does not occur during the heat treatment within the chamber. The hermetical sealing and joining process can therefore be stably carried out.

In addition, since electrical connection of the connector electrode 12 of the surface acoustic wave element 1 has already been accomplished through the foregoing temporary fixing process, short circuit occurs between adjacent electrode fingers of the IDT electrode 11 of the surface acoustic wave element 1 through the metal heater block. Accordingly, as in the temporary fixing process, pyroelectric breakdown does not occur. Therefore, temperature can be elevated and decreased at increased speeds during the heat treatment. Owing to this and the further added advantage of the collective processing using the large-size base substrate 2, highly efficient manufacturing of surface acoustic wave devices can be realized.

Furthermore, at an initial stage of hermetical sealing and joining process, the gap between the surface acoustic wave elements 1 and the large-size base substrate 2 can be immediately brought into the same atmosphere as the inside of the chamber, controlling the gap atmosphere is therefore very easy. That is, it is not necessary to greatly reduce the pressure inside the chamber, so that the oxygen concentration inside the chamber can be at a level that permits stable soldering, consequently improving the reliability of the hermetical sealing. Subsequently, epoxy resin paste or the like that forms an outer covering resin layer 5 is applied to the other principal surface (exposed surface) of the surface acoustic wave elements 1 that have been electrically connected and joined to the respective substrate sections 2 of the large-size base substrate 6 with the gap hermetically sealed, and then cured. At this time, since the surface area of each of the substrate sections of the large-size base substrate is greater than the surface area of the surface acoustic wave element 1, the epoxy resin also fills the gaps between every adjacent pair of the surface acoustic wave elements 1. That is, the other principal surface and four side surfaces of each of the surface acoustic wave elements 1 are covered with the outer covering resin layer 5 (See FIG. 9F).

Figure 9G:
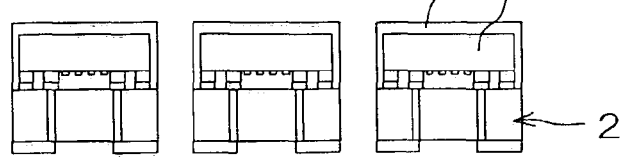

In the next step, the large-size base substrate 6 that has been provided with a plurality of the surface acoustic wave elements 1 mounted thereon and covered with the outer covering resin layers 5 is cut by dicing so that each of the substrate sections 2 is kept covered with the outer covering resin layer 5 (FIG. 9G). Through the steps described above, the surface acoustic wave device shown in FIG. 7 is obtained.

Incidentally, while both the first solder bump 30 for the solder bump component 3 and the second solder bump 40 for the solder sealing component 4 are formed on the side of the base substrate 2 (large-size base substrate), both of the first solder bump 30 and the second solder bump 40 may be formed on the side of the surface acoustic wave element 1, or the solder bumps maybe formed on different sides, that is, one may be formed on the side of the surface acoustic wave element 1 and the other may be formed on the side of the base substrate 2.

<Constitution of Solder Sealing Component>

Figure 10:
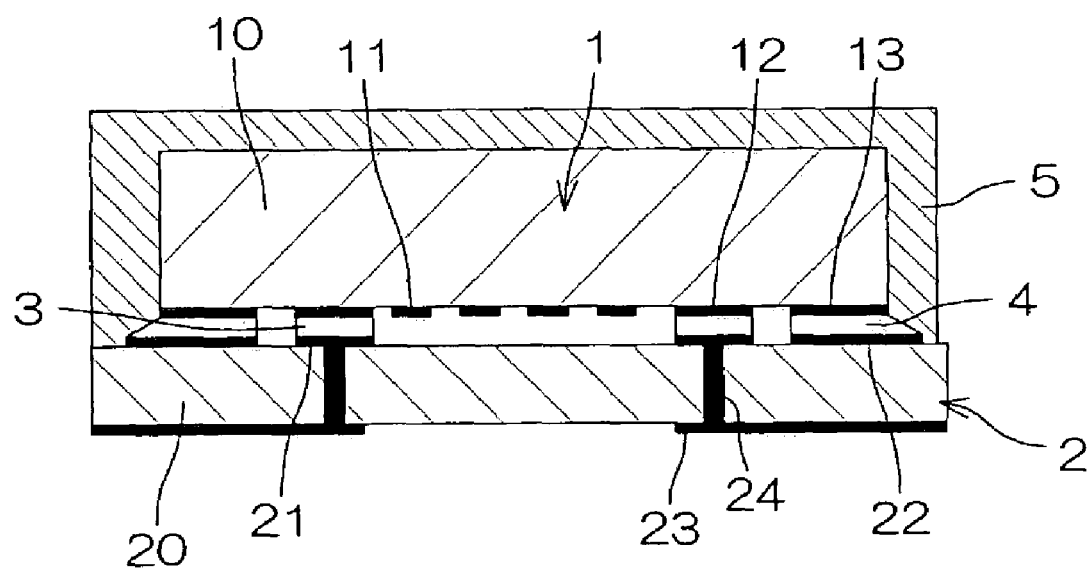
FIG. 10 shows a cross-sectional structure of a surface acoustic wave device according to still another embodiment of the present invention.

FIG. 10 is a cross-sectional view of still another embodiment of surface acoustic wave device according to the present invention.

The surface acoustic wave device comprises a surface acoustic wave element 1, a base substrate 2, a solder bump component 3, solder sealing component 4 and an outer covering resin layer 5. The components other than the solder sealing component 4 are of the same configuration and structure as those of the surface acoustic wave device described referring to FIG. 1, description thereof therefore will not be repeated here.

Figure 11A:
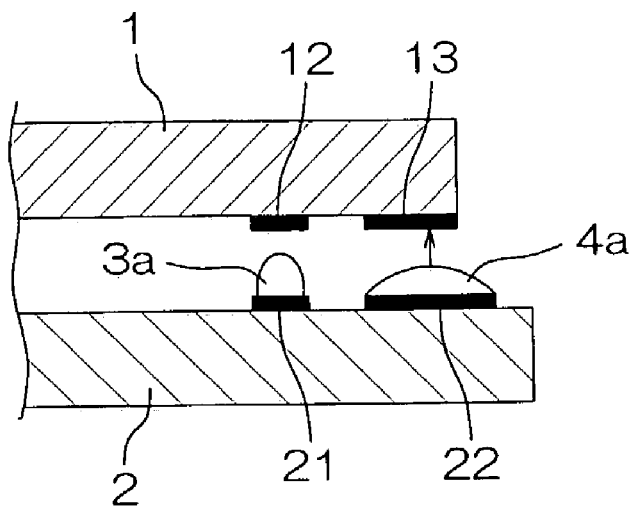
FIGS. 11A–11c are partial cross-sectional views illustrating steps from a step for temporarily fixing the solder bump component and the solder sealing component through a step for fusing the same in the method for manufacturing surface acoustic wave device according to the present invention.
Figure 11B:
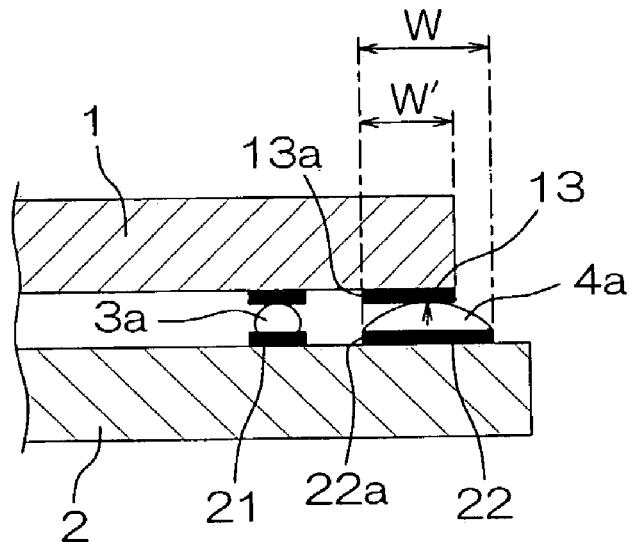
Figure 11C:
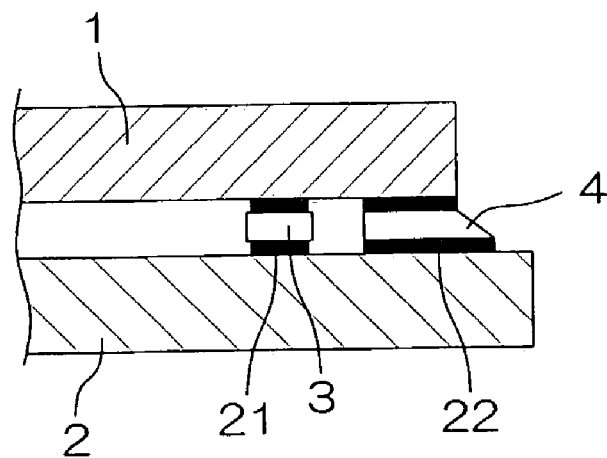
Figure 12:
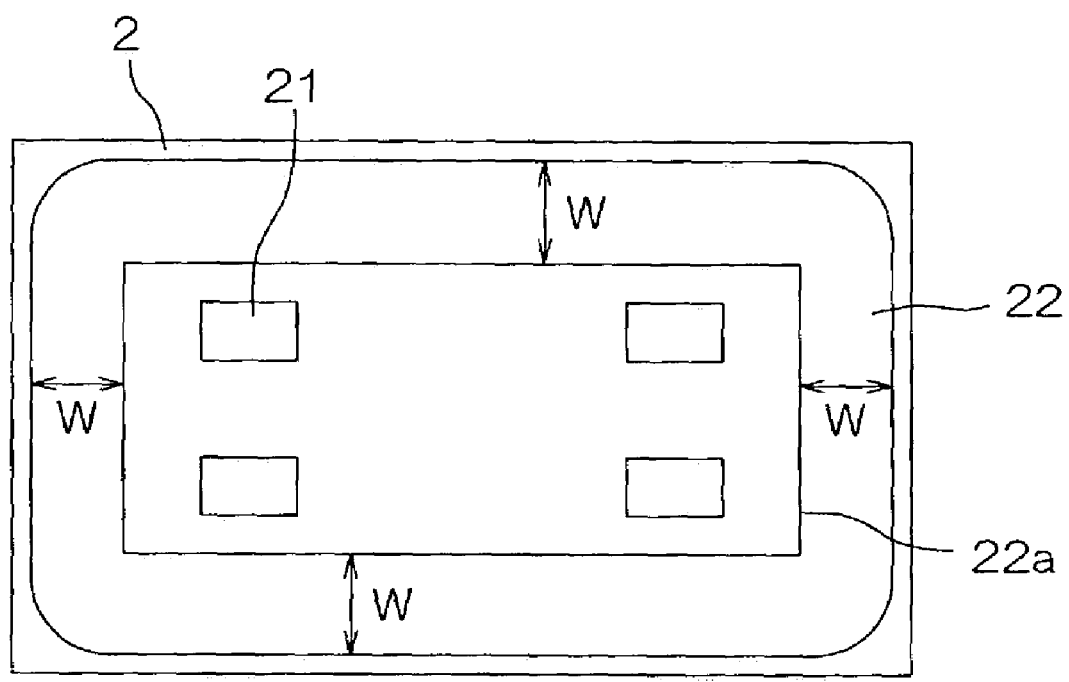
FIG. 12 is a plan view of a base substrate used for the surface acoustic wave device of FIG. 10.

FIG. 11A is a partial side view illustrating a state before the surface acoustic wave element 1 is temporarily fixed to the base substrate 2, and FIG. 11B is a partial side view illustrating a state after the surface acoustic wave element 1 is temporarily fixed to the base substrate 2. FIG. 11C is a partial side view illustrating a state after the surface acoustic wave element 1 and the base substrate 2 are joined together by means of the solder bump component 3 and the solder sealing component 4. FIG. 12 is a schematic plan view of a base substrate used for the surface acoustic wave device according to the present invention, where a periphery sealing conductor film 22 is formed as a hollow rectangular shape on the base substrate 2 so as to correspond to the shape of the surface acoustic wave element 1.

One of the particular features of, the present invention is that a conductor width W of the hollow periphery sealing conductor film 22 (See FIG. 11B, FIG. 12) is designed to be wider than a width w' of a hollow periphery sealing electrode 13 opposed thereto, and the shape of the inner periphery 22a of the periphery sealing conductor film 22 is generally identical to that of the inner periphery 13a of the periphery sealing electrode 13. In other words, when viewed from the top, the outer periphery of the periphery sealing conductor film 22 has a configuration that protrudes from the outer periphery of the periphery sealing electrode 13. The hollow periphery sealing conductor film 22 is arranged to have a substantially constant conductor width W throughout the area it extends, that is, at the corner portions as well as at side potions other than the corner portions. In addition, a reflow solder 4b for the solder sealing component 4 formed on the periphery sealing conductor film 22 is formed to fully cover the conductor width W of the periphery sealing conductor film 22.

A process for joining the base substrate 2 and the surface acoustic wave element 1 together is now described referring to FIGS. 11A–11C.

First, as shown in FIG. 11A, a reflow solder 3a for the solder bump component 3 is formed on an electrode 21 for connection to the element on the side of the base substrate 2, and a reflow solder 4a for the solder sealing component 4 is formed on the periphery sealing conductor film 22 on the side of the base substrate 2. The reflow solders 3a and 4a are formed, for example, in such a way that solder paste is applied a predetermined number of times onto the electrode 21 for connection to the element and the periphery sealing conductor film 22 in the base substrate section 2, and the applied solder paste is fused by heating.

Subsequently, in order to perform temporary fixing, the reflow solder 3a and reflow solder 4a are aligned with a connector electrode 12 of the surface acoustic wave element 1 and the periphery sealing electrode 13 of the surface acoustic wave element 1, respectively, and the surface acoustic wave element 1 is mounted on the base substrate 2.

Then, as shown in FIG. 11B, while heat (for example, at a temperature of 100–150° C.) for ensuring ultrasonic thermocompression bonding is applied to the base substrate 2, ultrasonic vibration is applied from the side of the surface of the acoustic wave element 1 together with a pressure so that they are temporarily fixed to each other. When the height of projection of the reflow solder 3a for the solder bump component 3 is larger than the height of projection of the reflow solder 4a for the solder sealing component 4, ultrasonic fusing first starts at the solder bump component 3 (3a), and as the height of projection of the solder bump component 3 (3a) becomes smaller, ultrasonic fusing also starts at the solder sealing component 4 (4a) on the periphery sealing conductor film 22.

Through the steps above, the temporary fixing is accomplished, so that misalignment of the surface acoustic wave element 1 can be prevented, stable connection between the surface acoustic wave element 1 and base substrate 2 can be maintained. Furthermore, a manufacturing method that greatly facilitates handling in the manufacturing processes such as transference can be realized.

Subsequently, as shown in FIG. 11C, with load applied from the side of the surface acoustic wave element 1, they are transferred into a reflow furnace where the temperature is higher than the melting point of the solder so as to fuse the solder bump component 3 and solder sealing component 4, thereby accomplishing electrical connection and hermetical sealing at the periphery between the surface acoustic wave element 1 and the base substrate 2. Incidentally, the process of fusion-joining is carried out by a reflow treatment (re-melting) with the application of load to the surface acoustic wave element 1.

In order to bring the gap between the surface acoustic wave element 1 and the base substrate 2 into a predetermined atmosphere, the joining steps are carried out in the predetermined atmosphere.

Because of the load applied from the side of the surface acoustic wave element 1 during the fusion-joining, the solder sealing component 4 between the periphery sealing conductor film 22 and periphery sealing electrode 13 is fusion-joined in a sufficiently depressed condition so that sealing is reliably accomplished.

Thereafter, with the load released, the specimen is slowly cooled from the melting temperature to room temperature. Then, the joining process is completed. This enables a great number of surface acoustic wave devices to be fabricated at one time and mass-produced at low cost. It is possible that particularly when the applied pressure is great, the fused solder is crushed narrowing the space between the electrodes, and in the worst case, short circuit failures would occur. However, by releasing the pressure as described above, appropriate connection and sealing conditions can be achieved.

Now, the relationship between the widths of the periphery sealing conductor film 22 and the periphery sealing electrode 13 is described.

Generally speaking, when the reflow solder 4a formed on the periphery sealing conductor film 22 on the side of the base substrate 2 is temporarily fixed, if the summit portion of the reflow solder 4a is subjected to ultrasonic thermocompression bonding while being in contact with the periphery sealing electrode 13 whose surface comprises a gold layer (Ni base and gold surface), an alloy layer with poor solder wettability is created. This is because the surface of the periphery sealing electrode 13 is alloyed with Sn contained in the solder sealing component 4a formed on the periphery sealing conductor film 22 on the base substrate 2 during the ultrasonic thermocompression bonding, resulting in the formation of a granular substance with poor solderability such as SiNi or SnAu mainly in the surface area in contact with the periphery sealing electrode 13. This alloy layer with poor adhesion does not merge into the solder. As a result, reliability in terms of moisture resistance at the outer peripheral sealing junction is impaired.

In particular, this alloy layer with poor adhesion is formed dominantly in the summit of the reflow solder 4a, namely, the summit portion of the semicircular cross section (indicated by an arrow in FIG. 11B). If the periphery sealing electrode 13 of the surface acoustic wave element 1 and the periphery sealing conductor film 22 of the base substrate 2 are of the same configuration and width, because of the reflow solder formed over the full width of the periphery sealing conductor film 22, the alloy layer with poor adhesion is caused to be located at the central area of the periphery sealing electrode 13. This alloy layer with poor adhesion, if located at the central area of the outer peripheral sealing area, causes the area for stable junction to be greatly decreased, impairing the reliability in terms of moisture resistance.

However, in the embodiment of the present invention, although the alloy layer with poor solder wettability is created mainly in the summit portion (marked by a triangle) of the solder sealing component 4a shown in FIG. 11B, as described above, since the outer edge of the periphery sealing conductor film 22 is arranged to protrude from the outer edge of the periphery sealing electrode 13 (i.e. W>w'), the summit portion of the solder sealing component 4a is located on the outer side of the width w' of the periphery sealing electrode 13. That is, when the fusion-joining in the reflow furnace is performed as in FIG. 11C, the fused solder stably becomes wet at an area internal to the center of the width w', that is, an area where an alloy layer with poor solder wettability is not formed. Thus, reliable soldering is accomplished with good sealing performance.

Accordingly, in comparison to conventional cases where the area with poor solder wettability is located at the center of the periphery sealing electrode, in the present invention, the area with poor solder wettability is arranged to be located outwardly from the center. As a result, the area that contributes to reliable soldering is increased.

In order to stably provide such a condition, as shown in FIG. 12, it is effective to arrange the conductor width W of the periphery sealing conductor film 22 on the base substrate 2 to be uniform. That is, the periphery of the conductor pattern of the periphery sealing conductor film 22 has a profile of a ¼ circle at the corner portions, and the inner and outer circumferences of the corner portions each have an arc pattern. In such a case, due to surface tension, the reflow solder formed at the corner portions is more likely to have a swelled shape than when formed at sides other than the corner portions.

Accordingly, the conductor width W of the periphery sealing conductor film 22 is arranged to be uniform so that the reflow solder 4a for the solder sealing component 4 on the periphery sealing conductor film 22 can have a generally uniform height at the corner portions as well as sides other than the corner portions. The entire peripheral portions can therefore be stably joined together.

In the present invention, it is preferred that the relationship between the width W of the periphery sealing conductor film 22 and the width w' of the periphery sealing electrode 13 is arranged such that the summit of the reflow solder 4a for the solder sealing component 4 is located outwardly from the center of the periphery sealing electrode 13.

In order that the fused solder can greatly contribute to the hermetical sealing and joining, it is important to reduce the amount of solder flowing toward the inner peripheries of the periphery sealing conductor film 22 and the periphery sealing electrode 13. It is therefore preferred that an inner peripheral portion 22a of the periphery sealing conductor film 22 and an inner peripheral portion of the periphery sealing electrode 13 are coincide with each other.

When the foregoing two aspects are taken into consideration on the assumption that the reflow solder 4a is formed over the full conductor width of the periphery sealing conductor film 22, the width W and electrode width w' are preferably arranged to satisfy w'<W and w'>W/2.

<Geometry of Outer Covering Resin Layer>

In conventional surface acoustic wave devices, an outer covering resin in liquid form is dripped from above the surface acoustic wave device and heated as it is for curing. For this reason, the resin layer after the curing is not spread uniformly on the upper surface of the surface acoustic wave device, and the cross-sectional profile is bent in the shape of an arc. Accordingly, the resin layer is formed to have a relatively large thickness causing the surface acoustic wave device itself to be thick, thereby failing to adequately meet the demand for miniaturized thin surface acoustic wave devices. In addition, since the upper surface of the surface acoustic wave device is bent in the shape of an arc and not flat, absorption by the absorption nozzle of the mounter at the time of mounting on the motherboard tends to be unsuccessful leading to the problem of lowering of the productivity.

The present invention therefore presents a method for forming a thin outer covering resin layer with excellent mountability without size fluctuation.

Figure 13:
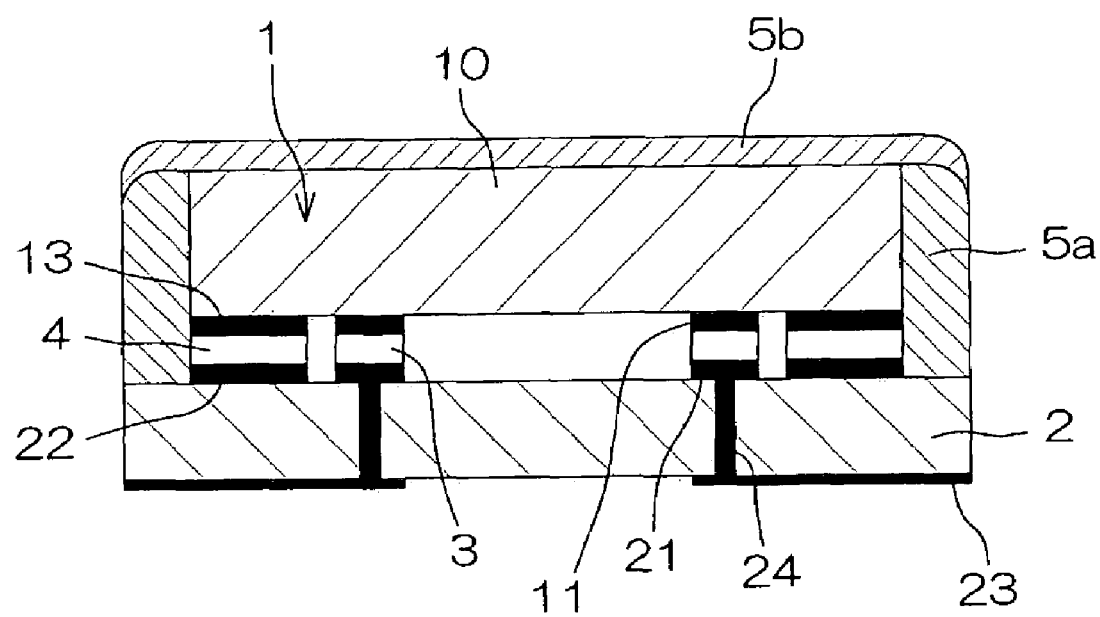
FIG. 13 shows a cross-sectional structure of yet another embodiment of the surface acoustic wave device according to the present invention.

FIG. 13 is a cross-sectional view of a surface acoustic wave device according to the present invention.

The surface acoustic wave device comprises a surface acoustic wave element 1, a base substrate 2, a solder bump component 3, a solder sealing component 4, side surface covering resin layers 5a and a top surface covering resin layer 5b.

The difference between the surface acoustic wave device of FIG. 1 and this embodiment is that the outer covering resin layer 5 consists of separate parts including the side surface covering resin layers 5a and the top surface covering resin layer 5b in this embodiment. The components other than this are the same as those of the surface acoustic wave device 1 in FIG. Description thereof is therefore omitted.

As shown in FIG. 13, the side surface covering resin layers 5a are formed to cover the side faces of the surface acoustic wave element 1, a periphery sealing electrode 13, a periphery sealing conductor film 22 and the solder sealing component 4.

The top surface covering resin layer 5b is formed so as to cover the upper surfaces of the other principal surface of the surface acoustic wave element 1and the side surface covering resin layers 5a. The top surface covering resin layer 5b contains a filler having a maximum particle size of 10–30 µm (30 µm at the maximum).

A method for manufacturing the surface acoustic wave device 1 mentioned above is now described. First, a collective substrate is prepared which comprises a plurality of base substrates 2 that are successively arranged each of which is formed with an electrode 21 for connection to the element, a periphery sealing conductor film 22 and an external terminal electrode 23, and surface acoustic wave elements 1 each formed with a connector electrode 12 and a periphery sealing electrode 13 are also prepared. On the electrodes 21 for connection to the element and the periphery sealing conductor films 22 of the collective substrate 1, solder bump components 3 and solder sealing components 4 are formed, respectively. The process described so far is similar to that described using FIGS. 4A–4C.

Figure 14A:
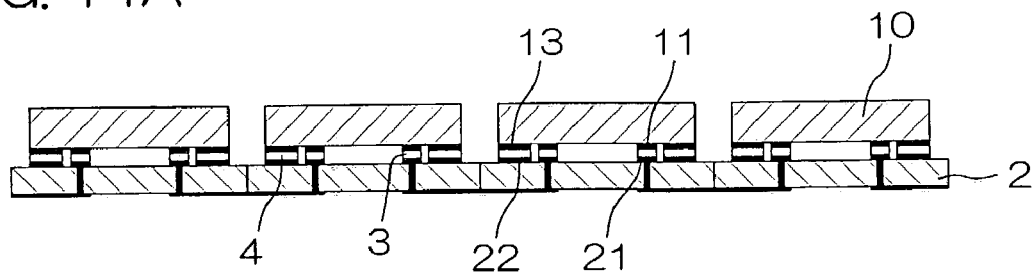
FIGS. 14A–14C are cross-sectional views illustrating steps included in the method for manufacturing the surface acoustic wave device of FIG. 13.

Subsequently, as shown in FIG. 14A, the surface acoustic wave elements 1 are mounted on the base substrates 2 so that the connector electrodes 12 and electrode 21 for connection to the element are opposed to each other, and the periphery sealing electrodes 13 and periphery sealing connector films 22 are opposed to each other. Then a solder reflow treatment is performed so as to join the connector electrodes 12 to the electrodes 21 for connection to the element through the solder bump components 3, and the periphery sealing electrodes 13 are joined to the periphery sealing connector films 22 through the solder sealing component 4.

Through this step, a gap corresponding to the height of the solder bump component 3 and solder sealing component 4 is formed between one principal surface of the surface acoustic wave element 1 and the surface of the base substrate 2, and the gap is hermetically sealed. Accordingly, surface acoustic waves are allowed to propagate stably on the principal surface of the surface acoustic wave element 1.

Figure 14B:
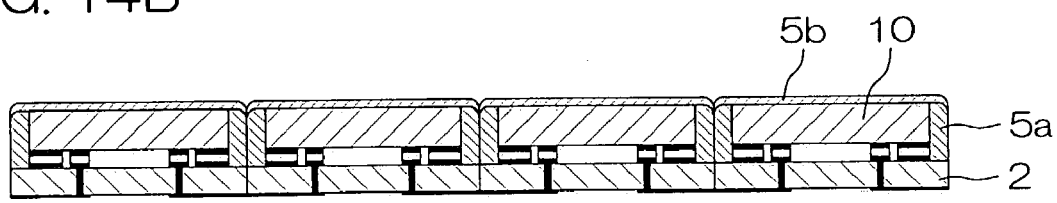

Now the step shown in FIG. 14B is described. First, the side surface covering resin layers 5a are interposed among the surface acoustic wave elements 1 on the collective substrate. Since the side surface covering resin layers 5a are, for example, made of an epoxy-based resin which is a resin in liquid form with flowability containing a solvent, they are interposed among the surface acoustic wave elements 1 by injection of the resin.

Subsequently, the top surface covering resin layers 5b are formed by screen printing or the like on the other principal surfaces of the surface acoustic wave elements 1 and on the upper surfaces of the side surface covering resin layers 5a.

Thereafter, the side surface covering resin layers 5a and top surface covering resin layers 5b are simultaneously cured, for example, by heating at 150° C. for 1 hour.

Figure 14C:
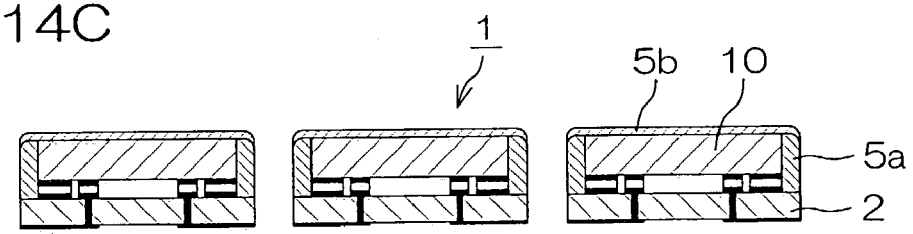

Then, as shown in FIG. 14C, the surface acoustic wave elements 1 are cut into individual ones with the use of a dicing saw, thereby obtaining the surface acoustic wave device 1 shown in FIG. 13.

One of the particular features of the present invention is that the method for forming the side surface covering resin layers 5a and top surface covering resin layers 5b on the surface acoustic wave elements 1 comprises the steps of: interposing the side surface covering resin layers 5a among the surface acoustic wave elements 1; printing the top surface covering resin layers 5b on the upper surfaces of the other principal surfaces of the surface acoustic wave elements 1 and the side surface covering resin layers 5a; and simultaneously curing the side surface covering resin layers 5a and the top surface covering resin layers 5b.

That is, the side surface covering resin layers 5a are interposed among the surface acoustic wave elements 1 so as to fill the gaps among the surface acoustic wave elements 1 and reduce the difference in level, and thereafter the top surface covering resin layers 5b are formed by printing on the upper surfaces of the other principal surfaces of the surface acoustic wave elements 1 and the side surface covering resin layers 5a. With this arrangement, the upper surfaces of the other principal surface of the surface acoustic wave elements 1 and the side surface covering resin layers 5a can be covered with the top surface covering resin layers 5b with a small, uniform thickness.

Accordingly, the surface acoustic wave device can be made thinner and the flat surface obtained in the section of the surface acoustic wave element ensures absorption by the mounter when it is mounted on the motherboard causing no failure, thus a surface acoustic wave device with excellent mountability can be realized.

In addition, since the top surface covering resin layer 5b contains a filler with a maximum particle size of 10–30 µm (30 µm at the maximum), the thickness of the layer can be the greatest filler diameter, which is 30 µm. Although the thickness of the top surface covering resin layer 5b is preferably as thin as possible to obtain a thinner surface acoustic wave device, when it is too thin, the strength thereof is lowered causing cracking and peeling to occur when the surface acoustic wave elements 1 are cut by a dicing saw or the like to be separated into individual ones. Accordingly, in order to achieve the minimum layer thickness of 30 µm adequate for practical use, a filler having a maximum particle size of 10–30 µm is contained. Thus, the thinner device mentioned above can be produced while the flatness of the top surface covering resin layer 5b is ensured.

Furthermore, when the top surface covering resin layer 5b comprises epoxy resin containing carbon black, because of the very fine particle size of the carbon black, which is 10 nm–500 nm, the top surface covering resin layer 5b can be formed with a small thickness.

A further feature of the present invention is that the side surface covering resin layer 5a is interposed among the surface acoustic wave elements 1 to have a cross-sectional profile bent as a bow at the upper surface. That is, while a first level of the upper surface of the side surface covering resin layer 5a in contact with the surface acoustic wave element 1 is equal to the level of the upper surface of the surface acoustic wave element 1, a second level of the upper surface located in the regions to be cut is lower than the first level of the upper surface.

Figure 15A:
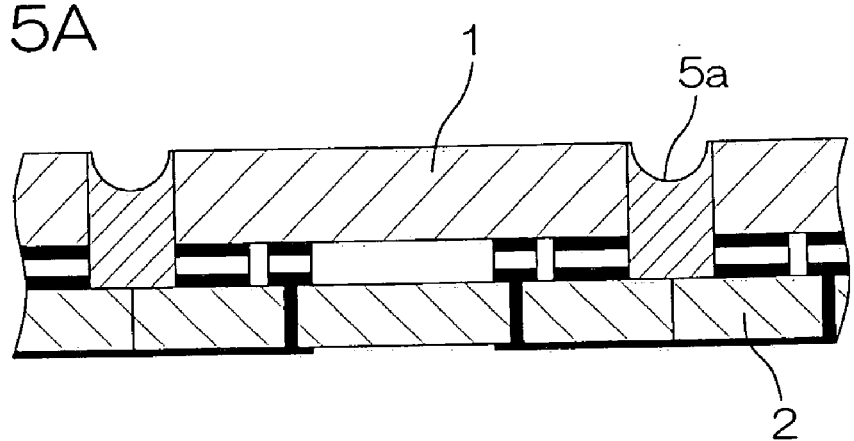
FIG. 15A is a cross-sectional view illustrating a state where a side surface covering resin has been formed in the method for manufacturing the surface acoustic wave device of FIG. 13.
Figure 15B:
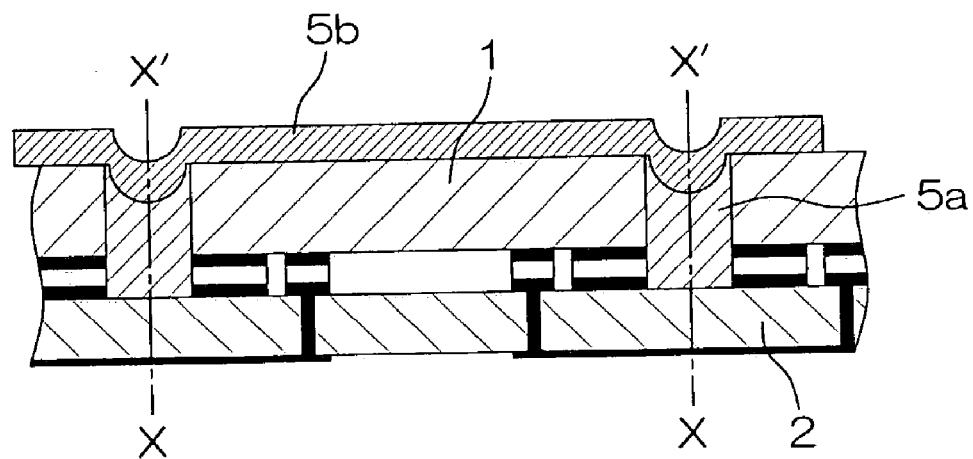
FIG. 15B is a cross-sectional view illustrating a state where a top surface covering resin has been formed.

This feature will be described in detail referring to FIGS. 15A, 15B. As shown in FIG. 15A, the side surface covering resin layer 5a comprises a liquid resin containing a solvent, which is to have an elevated surface in the parts in contact with the surface acoustic wave elements 1 as a result of a capillary phenomenon when injected among the surface acoustic wave elements 1. When, as shown in FIG. 15B, the top surface covering resin layer 5b is printed and the side surface covering resin layers 5a and top surface covering resin layer 5b are simultaneously cured in this condition, the top surface covering resin layer 5b is also formed to have a cross-sectional profile bent as a bow i.e., a recessed cross-sectional profile, at the portions on the side surface covering resin layers 5a.

Figure 16A:
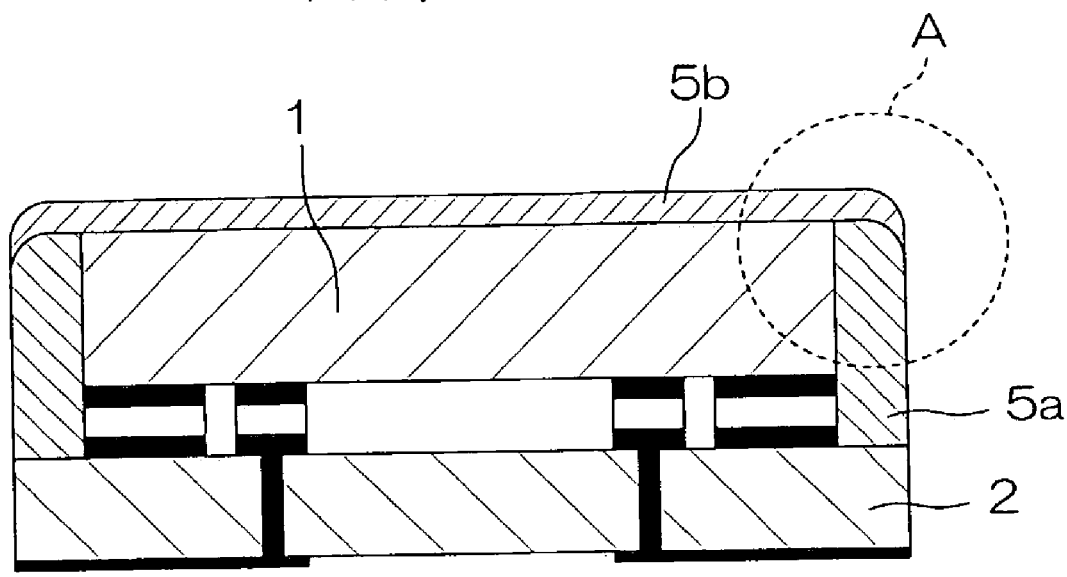
FIG. 16A is a cross-sectional view showing an edge portion of the outer covering resin on the top surface of the surface acoustic wave device of FIG. 13.
Figure 16B:
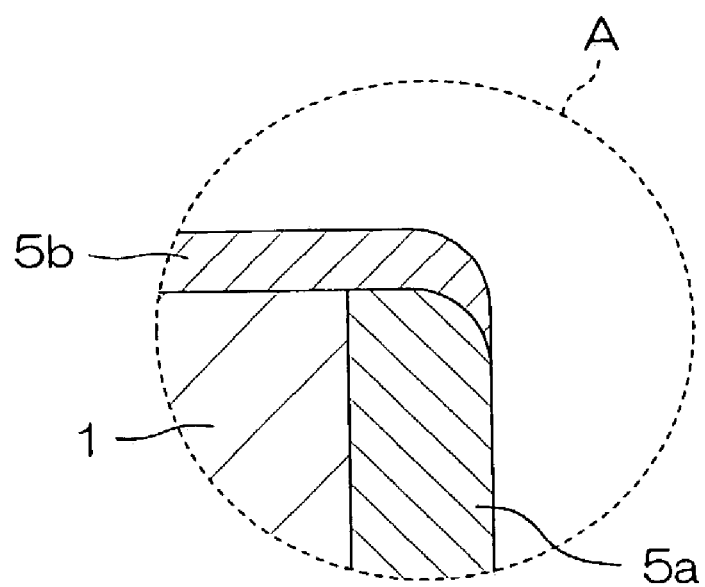
FIG. 16B is an enlarged view of the part A of FIG. 16A.

After the surface acoustic wave devices 1 are separated into individual ones along the line x–x', as shown in FIGS. 16A, 16B, the top surface covering resin layer 5b is formed flat in the section of the surface acoustic wave element 1, while it is radiused in the extending parts on the side surface covering resin layers 5a. As a result, the top surface covering resin layer 5b has radiused edges while being a thin layer, and can be maintained without incurring chipping or cracking due to impacts from the outside.

The above-described side surface covering resin is, for example, a thermosetting resin comprising 60–73% by weight of an inorganic filler, 12–23% by weight of an epoxy resin component, 8–15% by weight of a curing agent component, and 0.7–1% by weight of a silicone elastomer component. Since volume contraction occurs due to the hardening of the epoxy resin component during heat curing, formation of the cross-sectional profile bent as a bow is further promoted resulting in a more effective configuration.

<Elastic Modulus of Side Surface Covering Resin>

Figure 17:
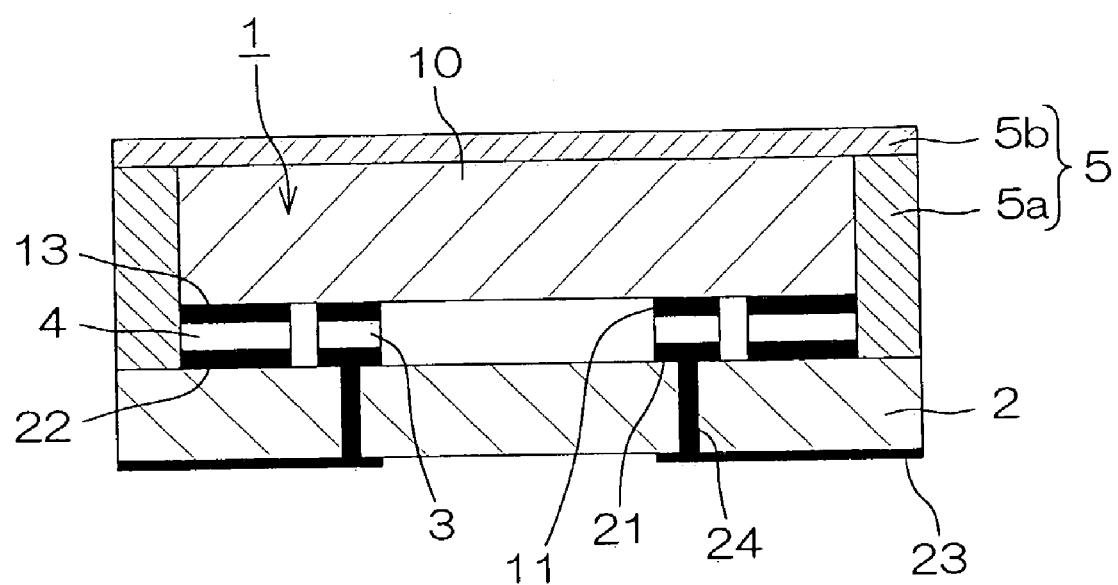
FIG. 17 shows a cross-sectional structure of yet another embodiment of the surface acoustic wave device according to the present invention.

FIG. 17 is a cross-sectional view of another embodiment of surface acoustic wave device according to the present invention.

The surface acoustic wave device comprises a surface acoustic wave element 1, a base substrate 2, a solder bump component 3, a solder sealing component 4 and an outer covering resin layer 5.

As described earlier referring to FIGS. 4A–4F and FIGS. 9A–9G, the surface acoustic wave element 1 is joined by soldering and electrically connected to the base substrate 2. The outer covering resin layer 5 is formed so as to cover the other principal surface and the side surfaces of the surface acoustic wave element 1.

The outer covering resin layer 5 comprises a top surface covering resin layer 5a and side surface covering resin layers 5b. However, formation o f the top surface covering resin layer 5a may not be always necessary as long as sufficient strength against mechanical shocks from the outside is maintained.

The particular feature of the present invention here is that the side surface covering resin layer 5b has an elastic modulus that follows changes of the gap between the surface of the base substrate 2 and the surface acoustic wave element 1 caused by volume expansion at a temperature at which the solder bump component 3 and solder sealing component 4 fuse.

Figure 18A:
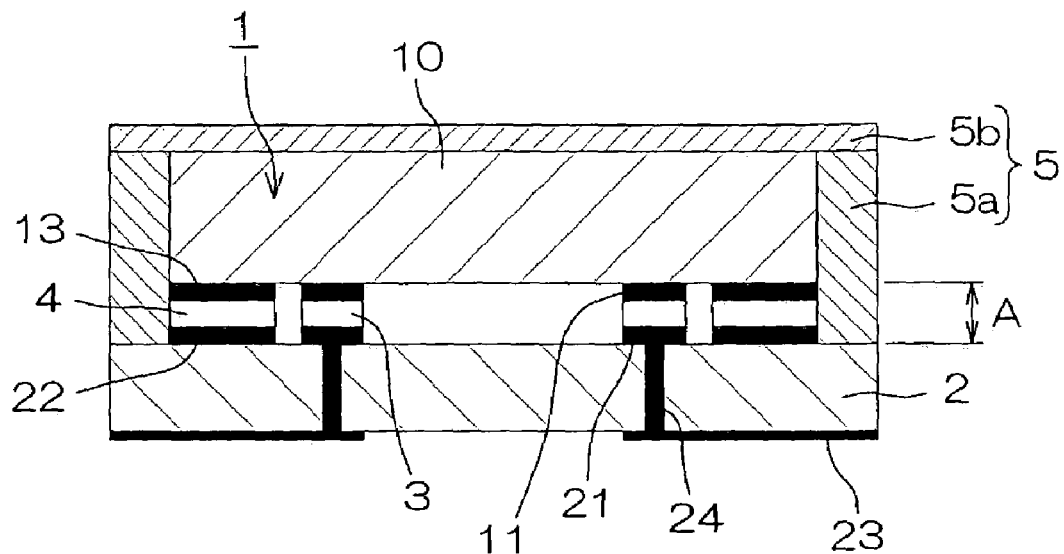
FIG. 18A is a cross-sectional view of a surface acoustic wave device according to the present invention when the solder bump component and solder sealing component harden.
Figure 18B:
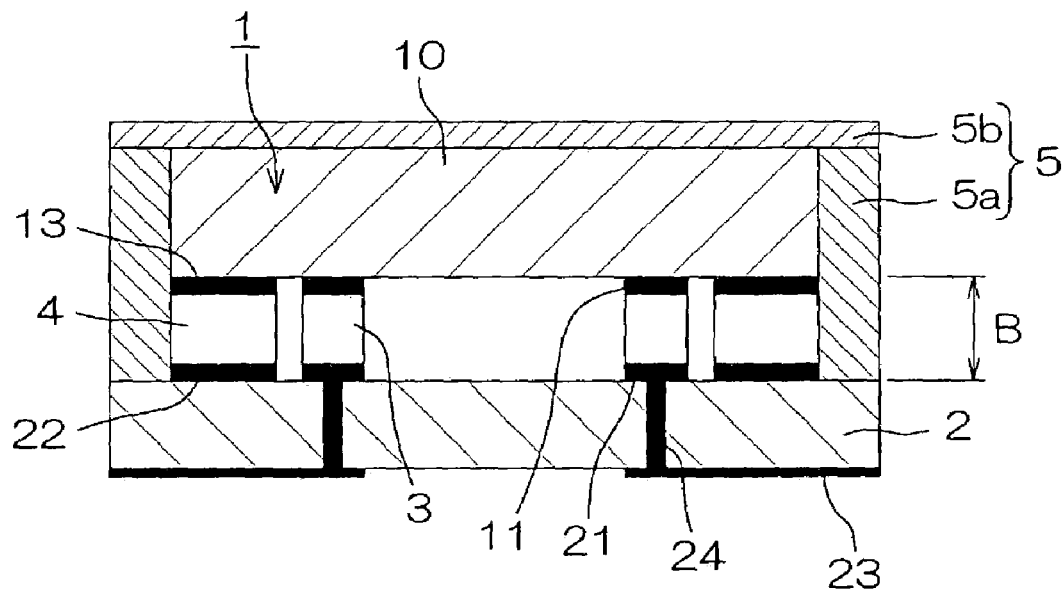
FIG. 18B is a cross-sectional view of the device when the solder bump component and solder sealing component melt.

That is, when the surface acoustic wave device 1 is mounted on a motherboard or the like, the solder bump component 3 and solder sealing component 4 are fused by the heat of solder reflow and the like causing expansion of the volume and generating force acting to lift the surface acoustic wave element 1. At this time, the side surface covering resin layers 5b expand enabling the gap between the surface of the base substrate 2 and the principal surface of the surface acoustic wave element 1 to expand. In other words, as shown in FIG. 18A, the gap A between the surface of the base substrate 2 and the principal surface of the surface acoustic wave element 1 before the mounting on the motherboard changes into the gap B shown in FIG. 18B as a result of volume expansion due to the fusing of the solder bump component 3 and solder sealing component 4. Here, the relation gap A< gap B is satisfied, so that the gap between the surface of the base substrate 2 and the principal surface of the surface acoustic wave element 1 expands. Therefore, the volume expansion (in particular, vertical movement) of the solder bump component 3 and solder sealing component 4 will not be hindered. Accordingly, unlike in conventional cases, there is no risk of short circuit failures occurring as a result of fused solder flowing toward the interior in the gap between the surface acoustic wave element 1 and the base substrate 2.

The material for the side surface covering resin layers 5b is a resin component with thermal reversibility, for example, an epoxy-based resin component. For example, the side surface covering resin layers comprise an epoxy resin component, an inorganic filler, a curing agent component and a silicone elastomer component. The elastic modulus can be controlled by controlling the silicone elastomer component. The elastic modulus is 3.5–6 Gpa at 25° C. and 0.2–0.4 Gpa at 230° C.

Such a resin has strength necessary to protect the surface acoustic wave element 1 against impacts from the outside at ordinary temperatures such as 25° C., and at the same time, warpage due to the contraction upon curing of the resin can be prevented. In addition, because the elastic modulus drops at the temperature, for example, 230° C. at which the solder bump component 3 and solder sealing component 4 fuse, the resin can deform following the volume expansion during the fusing of the solder bump component 3 and solder sealing component 4, thus allowing the gap between the surface of the base substrate 2 and the principal surface of the surface acoustic wave element 1 to change. As a result, short circuit failures caused by solder flow will not occur, as well as the adhesion to the surface acoustic wave element 1 can be maintained.

Ten kinds of resins with different elastic moduli were used for the side surface covering resin layers 5b for an evaluation. The elastic moduli at 25° C. of these resins were varied between 1.5 Gpa and 8 Gpa. Surface acoustic wave devices 1 were each fabricated to have the side surface covering resin layers 5b comprising each of the ten kinds of resins. At the same time, for the purpose of evaluation of warpage, a 30 mm square substrate made solely of resin was fabricated for each devices. The resins were cured by heating at 100° C. for 1 hour, and at 150° C. for 3 hours. Then, the fabricated surface acoustic devices 1 were subjected to a free fall test in which they were dropped from a height of 1 m to a concrete floor to be checked whether cracking or chipping occurred in the resins or not, and the degrees of warpage of the 33 mm square substrates were measured. The results of evaluation including the elastic moduli at 25° C. of the resins, the numbers of defects due to the free fall test, and the degrees of warpage of the substrates are shown in Table 1.

TABLE 1

Elastic moduli at 25° C., free fall test results, and substrate warpage evaluation

| Sample# | Elastic modulus (GPa) | Defects during free fall test | Substrate warpage (mm) | Judgment |
|---|---|---|---|---|
| 1 | 1.5 | 5/50 | 0.03 | Unacceptable |
| 2 | 2 | 2/50 | 0.05 | Unacceptable |
| 3 | 3 | 1/50 | 0.05 | Unacceptable |
| 4 | 3.5 | 0/50 | 0.07 | Acceptable |
| 5 | 4 | 0/50 | 0.09 | Acceptable |
| 6 | 5 | 0/50 | 0.09 | Acceptable |
| 7 | 6 | 0/50 | 0.10 | Acceptable |
| 8 | 6.5 | 0/50 | 0.25 | Unacceptable |
| 9 | 7 | 0/50 | 0.27 | Unacceptable |
| 10 | 8 | 0/50 | 0.28 | Unacceptable |

When the elastic moduli of the resins are small, due to deterioration of the strength, defects such as cracking and chipping occur during the free fall test. As the elastic modulus increases, contraction upon hardening of the resin becomes great causing warpage to occur, which adversely affects the electric properties of the surface acoustic wave device. Accordingly, if the samples which suffered no defects during the free fall test and had degrees of warpage of 0.1 mm or less that do not affect the electric properties of the surface acoustic wave device are determined to be acceptable, samples #4, #5, #6 and #7 are acceptable, which means the resins having elastic moduli at 25° C. of 3.5–6 GPa may be selected.

Subsequently, surface acoustic wave devices formed with side surface covering resin layers 5b each comprising each of the same 10 kinds of resins and, for evaluation of the adhesion, samples in which a 1.8 mm square surface acoustic wave element 1 was formed with a resin layer were used. They were subjected to a solder reflow treatment, and the numbers of short circuit failures due to solder flow were checked. Also, the adhesions of the resins were measured using a die shear tester. The elastic moduli at 230° C. varied between 0.1 Gpa and 1.3 Gpa. The sample numbers used in Table 1 and Table 2 denote the same samples. The results of evaluation including the elastic moduli at 230° C. of the resins, the numbers of short circuit failures and adhesions are given in Table 2.

TABLE 2

Elastic moduli at 230° C., short circuit failures and degrees of adhesion

| Sample# | Elastic modulus (GPa) | Short circuit failure due to solder flow | Adhesion (Die shear) (N) | Judgment |
|---|---|---|---|---|
| 1 | 0.1 | 0/50 | 32.5 | Unacceptable |
| 2 | 0.15 | 0/50 | 35 | Unacceptable |
| 3 | 0.2 | 0/50 | 45 | Acceptable |
| 4 | 0.4 | 0/50 | 60 | Acceptable |
| 5 | 0.6 | 1/50 | 62.5 | Unacceptable |
| 6 | 0.8 | 1/50 | 72.5 | Unacceptable |
| 7 | 0.9 | 2/50 | 72.5 | Unacceptable |
| 8 | 1.0 | 2/50 | 75 | Unacceptable |
| 9 | 1.1 | 3/50 | 75 | Unacceptable |
| 10 | 1.3 | 4/50 | 78 | Unacceptable |

When the elastic modulus at 230° C. is small, the volume expansion of the fused solder can be sufficiently absorbed, causing no short circuit failure to occur due to solder flow. However, if the elastic modulus becomes too small, the adhesion to the surface acoustic wave element 1 drops. Accordingly, if samples which had no short circuit failures and had die shear strengths of 40N or more that are considered sufficient adhesions are determined to be acceptable, samples #3 and #4 are acceptable. That is, the resins having elastic moduli at 230° C. of 0.2–0.4 GPa may be selected.

Combining evaluations in Table 1 and Table 2 together gives the following conclusion. The resins having elastic moduli at 25° C. of 3.5–6 GPa and elastic moduli at 230° C. of 0.2–0.4 GPa can be used. The resin that satisfies the both conditions, which is the resin of sample #4, is usable.

The mass per unit volume of the solder bump component 3 and solder sealing component 4 at temperatures of 180–250° C. is, although it varies depending on the solder composition, about 5–8 g/cm$^3$. In comparison, the mass per unit volume of the surface acoustic wave element 1 at temperatures of 180–250° C. is about 2–3 g/cm$^3$, that of the side surface covering resin layers 5b is about 1–2 g/cm$^3$ and that of the top surface covering resin layer 5a is about 1–2 g/cm$^3$, which are smaller than the mass per unit volume of the solder bump component 3 and solder sealing component 4. For this reason, when the solder bump component 3 and solder sealing component 4 fuse, buoyancy is generated in the surface acoustic wave element 1 further ensuring expansion of the gap between the surface of the base substrate 2 and the principal surface of the surface acoustic wave element 1.

What is claimed is:

1. A surface acoustic wave device comprising:
a surface acoustic wave element including a piezoelectric substrate which includes one principal surface formed with an inter digital transducer electrode, a connector electrode connected to the inter digital transducer electrode and a periphery sealing electrode; and
a base substrate formed with an electrode for connection to the element that is connected to the connector electrode, and a periphery sealing conductor film joined to the periphery sealing electrode;
wherein the connector electrode and the electrode for connection to the element are joined together through a solder bump component, and the periphery sealing electrode and the periphery sealing conductor film are joined together through a solder sealing component between the base substrate and the surface acoustic wave element,
the solder bump component and the solder sealing component comprise a Sn—Sb based or Sn—Ag based lead-free solder containing 90% or more Sn, and
the base substrate has a thermal expansion coefficient of 9–20 ppm/° C.

2. The surface acoustic wave device according to claim 1, wherein the base substrate is a glass-ceramic substrate comprising glass-ceramics at interfaces among ceramic powder particles.

3. The surface acoustic wave device according to claim 1, wherein the base substrate is a resin substrate reinforced with an inorganic fiber.

4. The surface acoustic wave device according to clam 1, wherein a relationship of (S1/L1)>(S2/L2) is satisfied where the area of a vertical cross-section of the solder bump component is S1, the area of a vertical cross-section of the solder sealing component is S2, the soldering width of a vertical cross-section of the connector electrode formed on the surface acoustic wave element is L1, and the soldering width of a vertical cross-section of the periphery sealing electrode of the surface acoustic wave element is L2.

5. The surface acoustic wave device according to claim 1, wherein the conductor width of the periphery sealing conductor film of the base substrate is larger than the electrode width of the periphery sealing electrode of the surface acoustic wave element, and the configuration of an inner periphery of the periphery sealing conductor film and the configuration of air inner periphery of the periphery sealing electrode are generally identical to each other.

6. The surface acoustic wave device according to claim 5, wherein the periphery sealing conductor film has a substantially uniform conductor width throughout the entire path thereof, and the width of the solder sealing component joined to the periphery sealing conductor film is identical to the conductor width of the periphery sealing conductor film.

7. A surface acoustic wave device comprising:
a surface acoustic wave element including a piezoelectric substrate which includes one principal surface formed with an inter digital transducer electrode, a connector electrode connected to the inter digital transducer electrode and a periphery sealing electrode; and
a base substrate which is formed with an electrode for connection to the element that is connected to the connector electrode, and a periphery sealing conductor film joined to the periphery sealing electrode,
wherein the connector electrode and the electrode for connection to the element are joined together through a solder bump component, and the periphery sealing electrode and the periphery sealing conductor film are joined together through a solder sealing component between the base substrate and the surface acoustic wave element,
a side surface covering resin layer is attached to cover a side surface of the surface acoustic wave element and an outer peripheral surface of the solder seating component, wherein the side surface covering resin layer has an elastic modulus of 3.5–6 GPa at 25° C. and an elastic modulus of 0.2–0.4 GPa at 230° C.

8. The surface acoustic wave device according to claim 7, wherein the side surface covering resin layer comprises a resin having thermal reversibility.

9. The surface acoustic wave device according to claim 7, wherein a mass per unit volume at temperatures between 180° C. and and 250° C. of the surface acoustic wave element and the side surface covering resin layer is smaller than a mass per unit volume at temperatures between 180° C. and 250° C. of the solder bump component and the solder sealing component.

10. The surface acoustic wave device according to claim 7, wherein a space formed by the surface acoustic wave element, the base substrate and the solder sealing component is hermetically filled with air or an inert gas including nitrogen.

11. A surface acoustic wave device comprising:
a surface acoustic wave element including a piezoelectric substrate which includes one principal surface formed with an inter digital transducer electrode, a connector electrode connected to the inter digital transducer electrode and a periphery sealing electrode; and
a base substrate which is formed with an electrode for connection to the element that is connected to the connector electrode, a periphery sealing conductor film joined to the periphery sealing electrode and an external terminal electrode,
wherein the connector electrode and the electrode for connection to the element are joined together through a solder bump component, and the periphery sealing electrode and the periphery sealing conductor film are joined together through a solder sealing component so that a predetermined gap is formed between the base substrate and the surface acoustic wave element,
a side surface covering resin layer is attached to cover a side surface of the surface acoustic wave element and an outer peripheral surface of the solder sealing component, and the side surface covering resin layer has an elastic modulus which follows a change of a gap between the base substrate and the surface acoustic wave element caused by volume expansion of the solder bump component and the solder sealing component at a melting temperature of the solder bump component and the solder sealing component,
wherein the conductor width of the periphery sealing conductor film of the base substrate is larger than the electrode width of the periphery sealing electrode of the surface acoustic wave element, and the configuration of an inner periphery of the periphery sealing conductor film and the configuration of an inner periphery of the periphery sealing electrode are generally identical to each other.

* * * * *